United States Patent
Hopkin et al.

(10) Patent No.: US 10,636,936 B2
(45) Date of Patent: Apr. 28, 2020

(54) MEMS ARRAY SYSTEM AND METHOD OF MANIPULATING OBJECTS

(71) Applicant: Sharp Kabushiki Kaisha, Osaka (JP)

(72) Inventors: Hywel Hopkin, Oxford (GB); Nathan James Smith, Oxford (GB); Andrew Kay, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/911,744

(22) Filed: Mar. 5, 2018

(65) Prior Publication Data

US 2019/0273177 A1    Sep. 5, 2019

(51) Int. Cl.
| | |
|---|---|
| *H01L 33/00* | (2010.01) |
| *B81C 1/00* | (2006.01) |
| *B81B 7/00* | (2006.01) |
| *B81B 3/00* | (2006.01) |
| *H01L 25/075* | (2006.01) |

(52) U.S. Cl.
CPC .......... *H01L 33/005* (2013.01); *B81B 3/0021* (2013.01); *B81B 7/0061* (2013.01); *B81C 1/0023* (2013.01); *B81C 1/00158* (2013.01); *B81C 1/00333* (2013.01); *H01L 25/0753* (2013.01)

(58) Field of Classification Search
CPC .............. B81C 1/0023; B81C 1/00333; B81C 1/00158; B81B 3/0021; B81B 7/0061; H01L 33/005
See application file for complete search history.

(56) References Cited

U.S. PATENT DOCUMENTS

| | | |
|---|---|---|
| 6,829,131 B1 | 12/2004 | Loeb et al. |
| 8,363,380 B2 | 1/2013 | Lan et al. |
| | (Continued) | |

FOREIGN PATENT DOCUMENTS

| | | |
|---|---|---|
| GB | 2469412 | 10/2010 |
| WO | WO 2013119761 | 8/2013 |
| | (Continued) | |

*Primary Examiner* — Phat X Cao
*Assistant Examiner* — Victor V Barzykin
(74) *Attorney, Agent, or Firm* — Renner, Otto, Boisselle & Sklar, LLP

(57) ABSTRACT

A micro-electro-mechanical systems (MEMS) array system is configured to apply suction forces for the manipulation of objects. The MEMS system includes includes a two-dimensional MEMS array of a plurality of individual MEMS elements. Each MEMS element comprises: a casing structure; a flexible membrane attached to the casing structure; and an electrode structure, wherein a voltage applied to the electrode structure actuates the MEMS element to cause the flexible membrane to flex relative to the casing structure. The flexible membrane and the casing structure define a gap into which the flexible membrane may flex, and a foot extends from the flexible membrane in a direction away from the casing structure, wherein the foot and the flexible membrane define a clearance region on an opposite side of the flexible membrane from the gap. When the MEMS element interacts with an object to be manipulated the foot spaces the membrane apart from the object. The MEMS array system further includes a control circuit that selectively actuates one or more of the MEMS elements of the MEMS array.

14 Claims, 19 Drawing Sheets

(56) References Cited

U.S. PATENT DOCUMENTS

| | | |
|---|---|---|
| 8,780,673 B2 | 7/2014 | Cohen et al. |
| 8,849,087 B2 | 9/2014 | Breen et al. |
| 2003/0044029 A1 | 3/2003 | Gabriel et al. |
| 2006/0226501 A1 | 10/2006 | Allen |
| 2011/0261370 A1* | 10/2011 | Floyd ........................ G01J 3/26 356/614 |
| 2013/0135705 A1* | 5/2013 | Hong ................... G02B 26/001 359/290 |

FOREIGN PATENT DOCUMENTS

| | | |
|---|---|---|
| WO | WO 2014141258 | 9/2014 |
| WO | WO 2016012409 | 1/2016 |
| WO | WO 2016116889 | 7/2016 |

* cited by examiner

Fig. 3
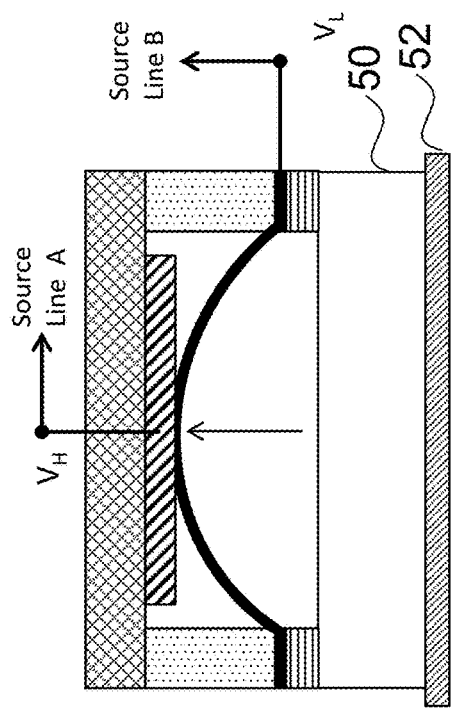
Fig. 3(a)
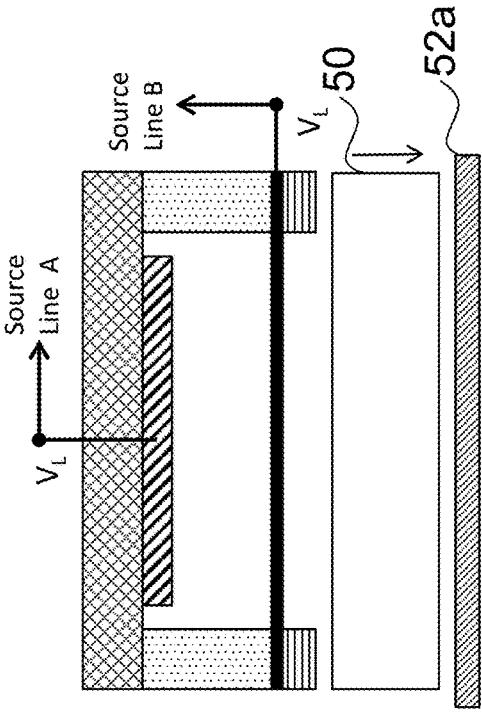
Fig. 3(b)
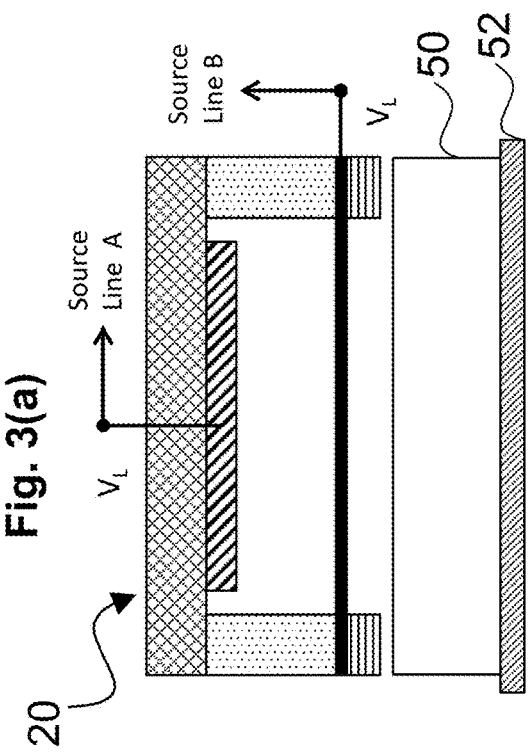
Fig. 3(c)
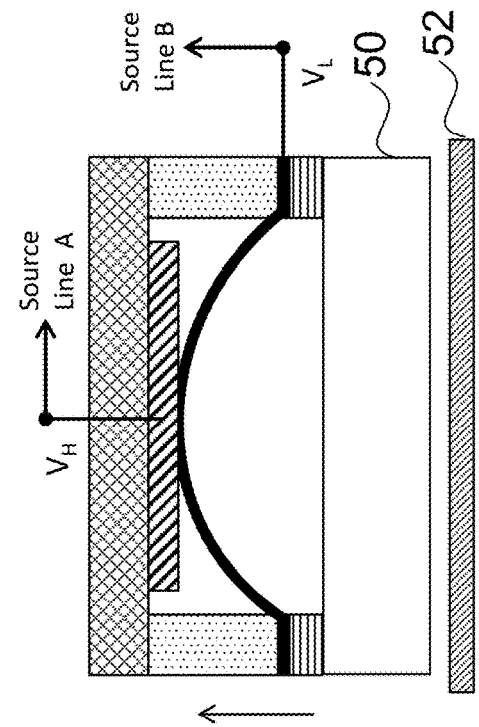
Fig. 3(d)

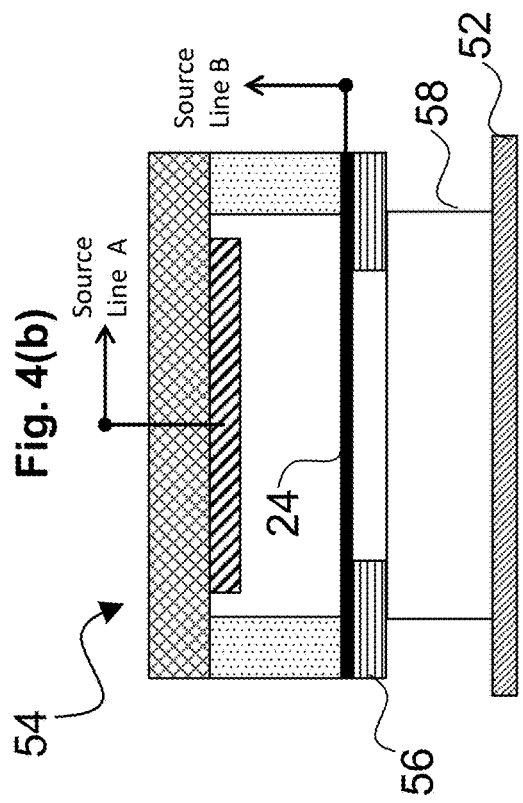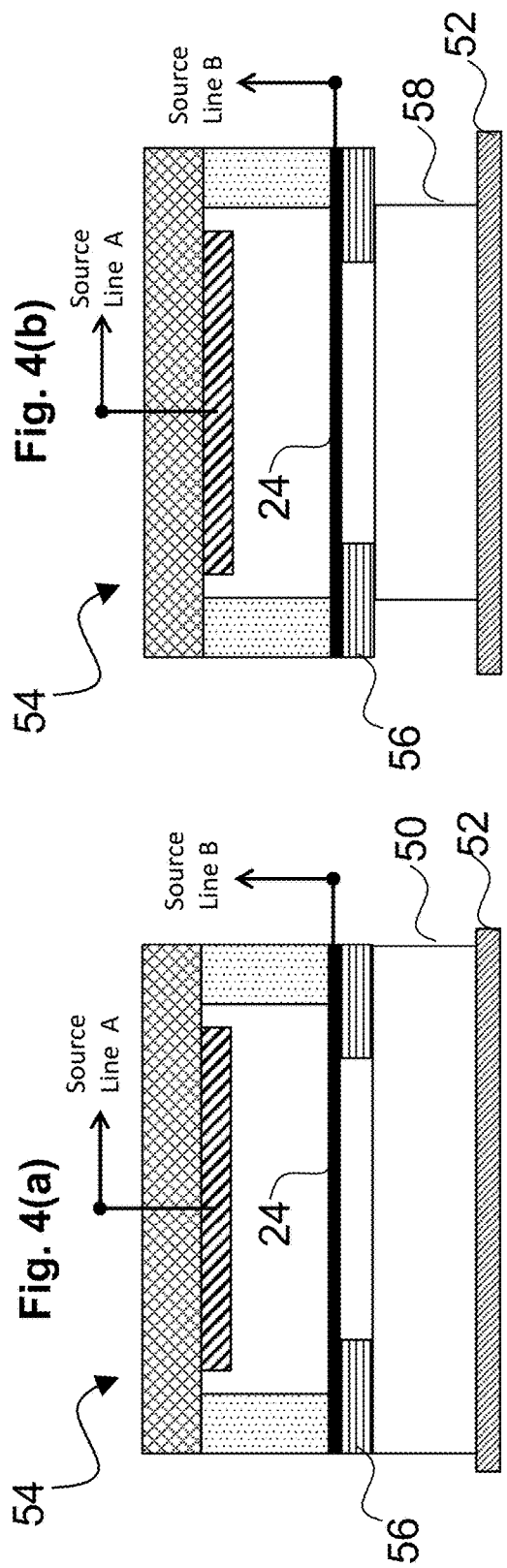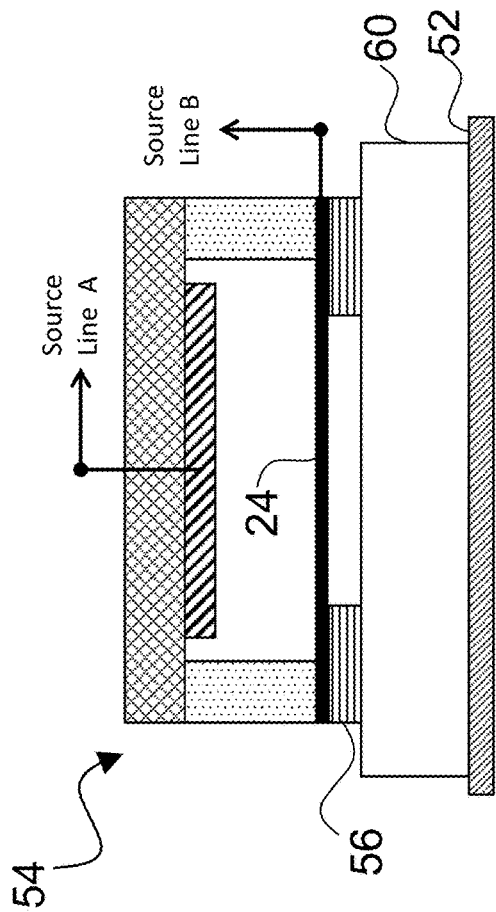

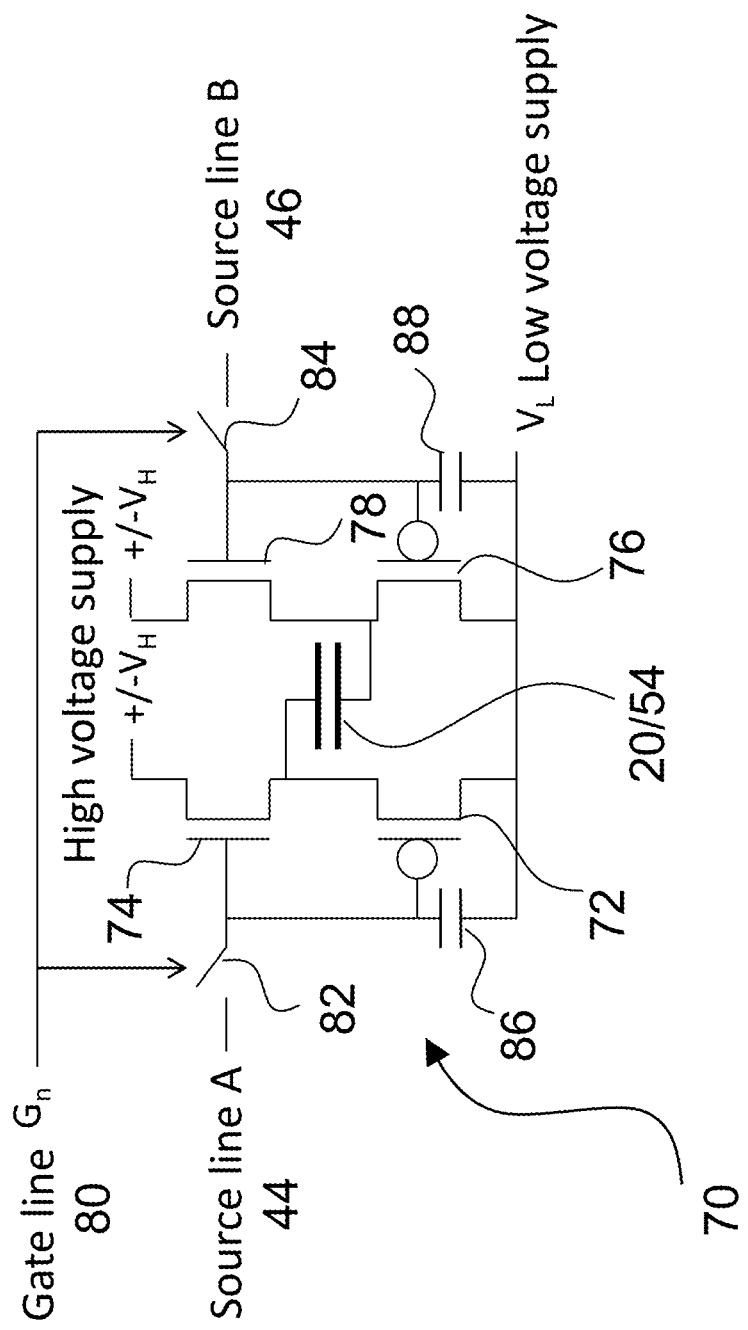

Fig. 6

| State | A | B |
|---|---|---|
| Off | 0 | 0 |
| On (1) | 0 | 1 |
| On (2) | 1 | 0 |
| Repel | 1 | 1 |

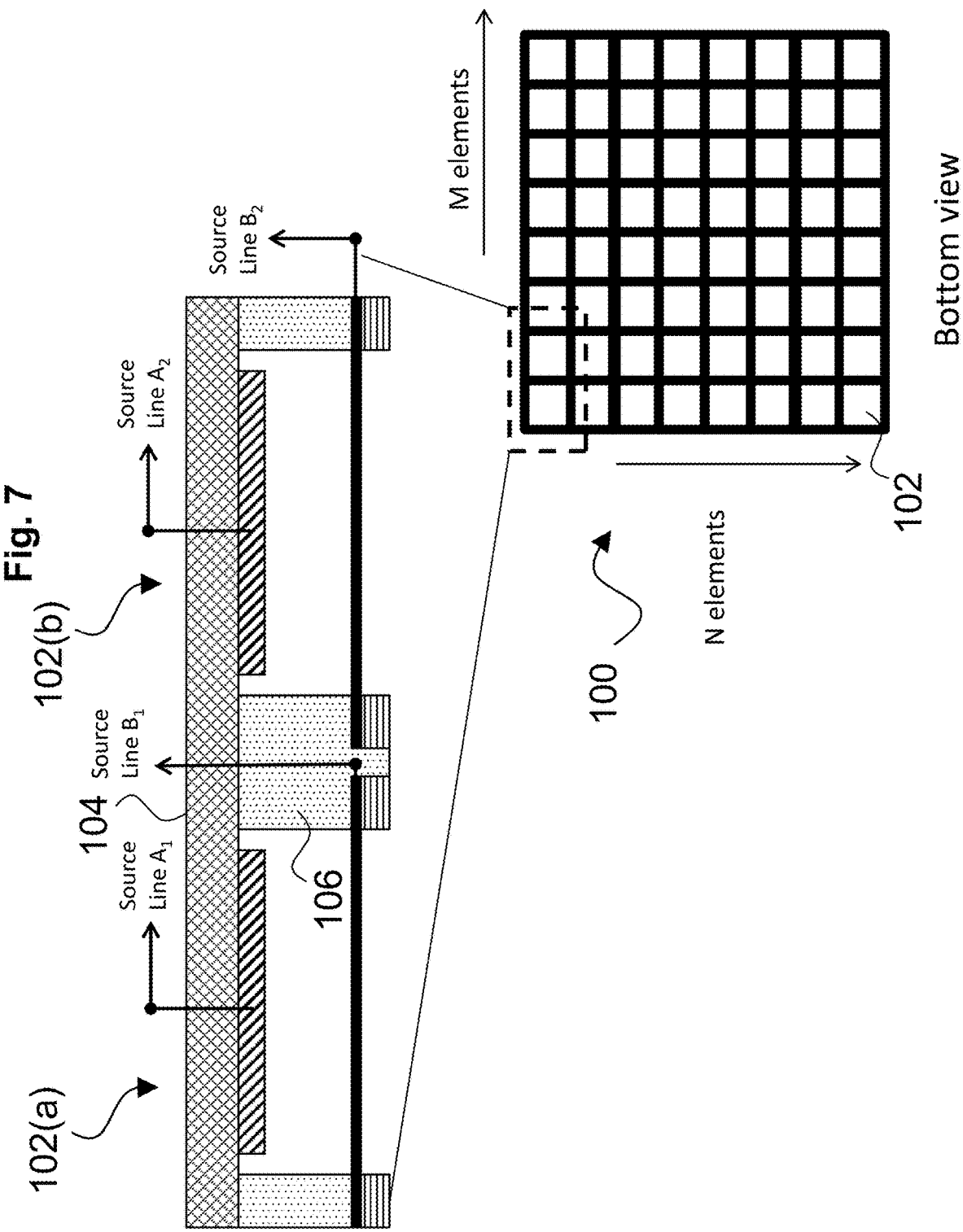

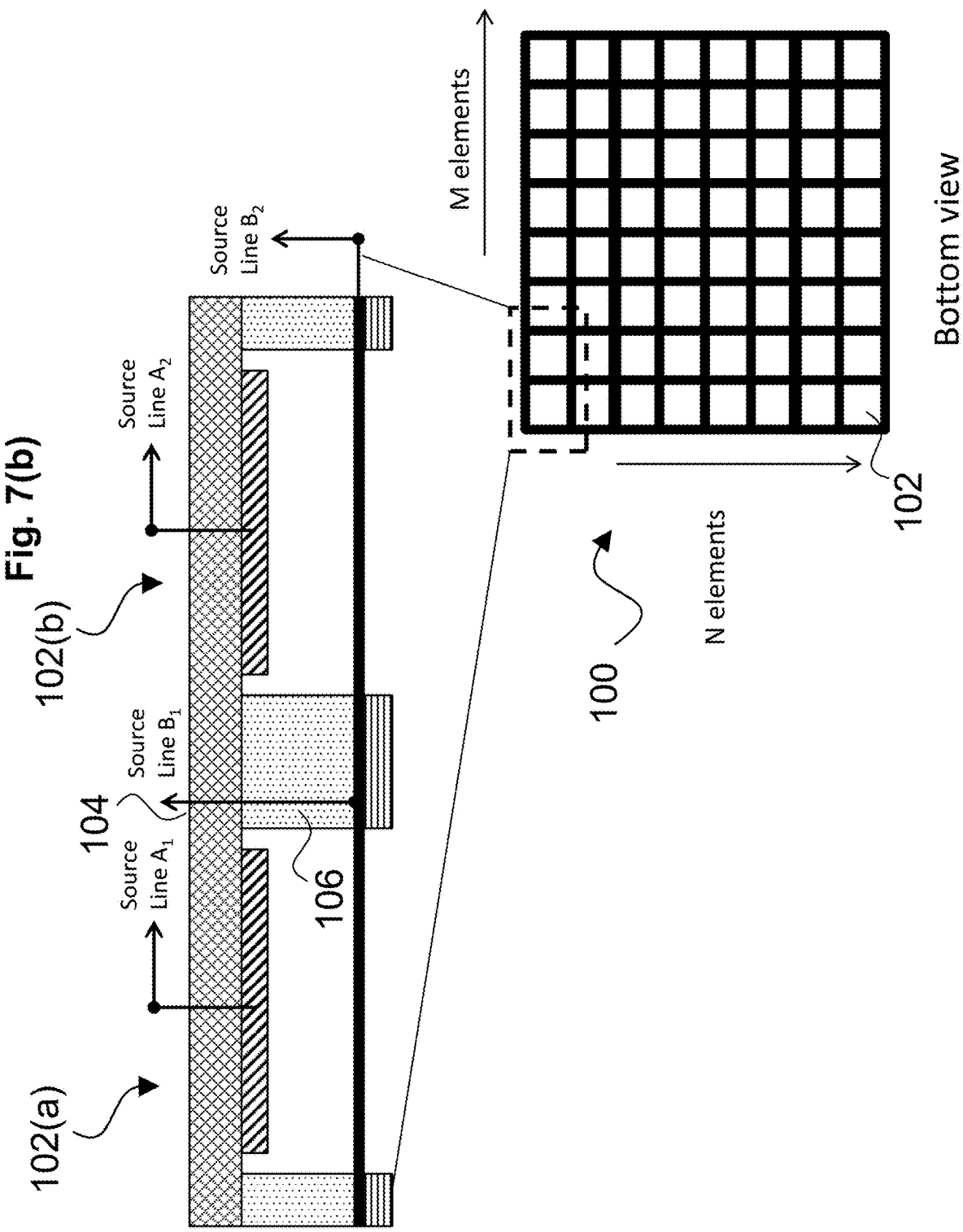

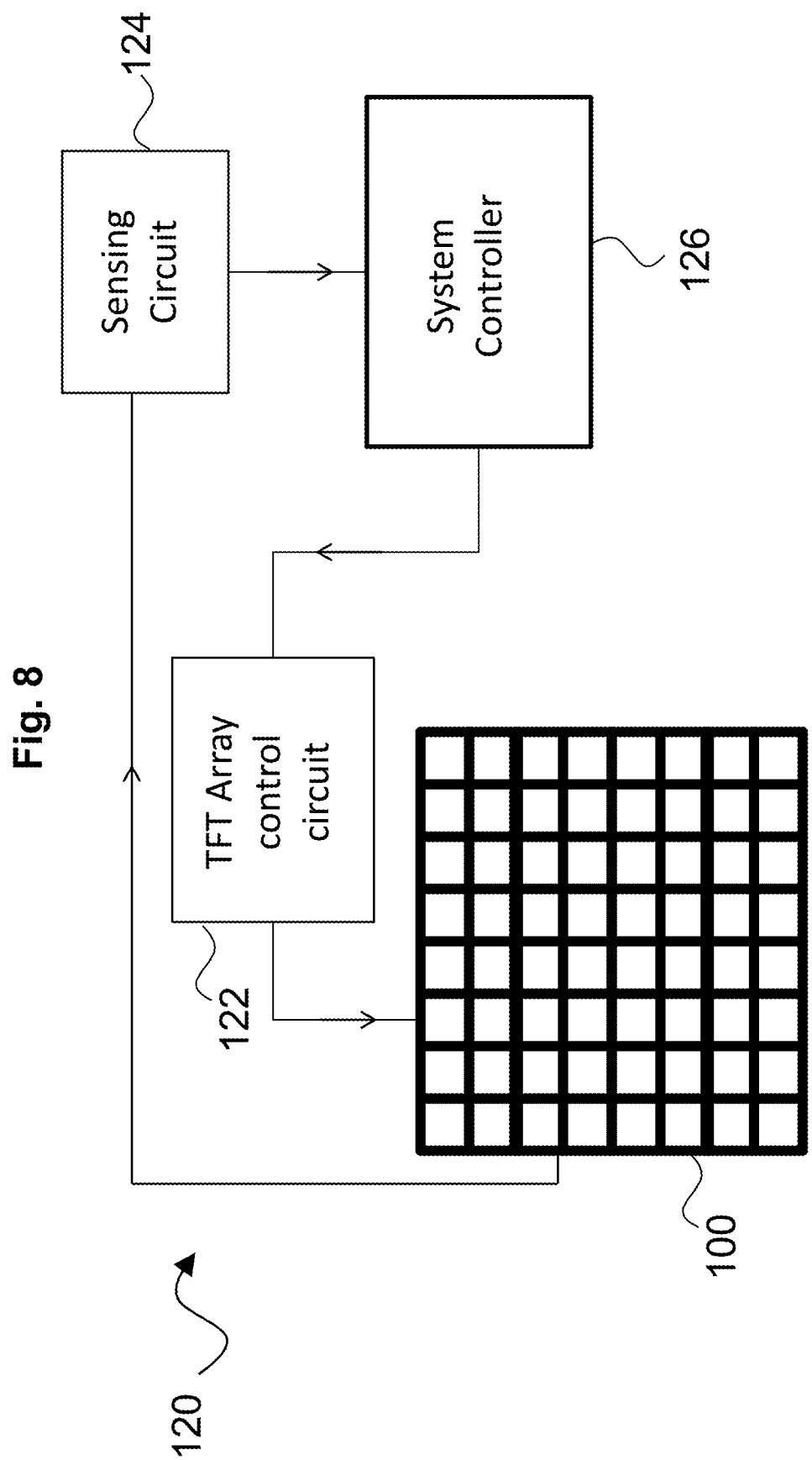

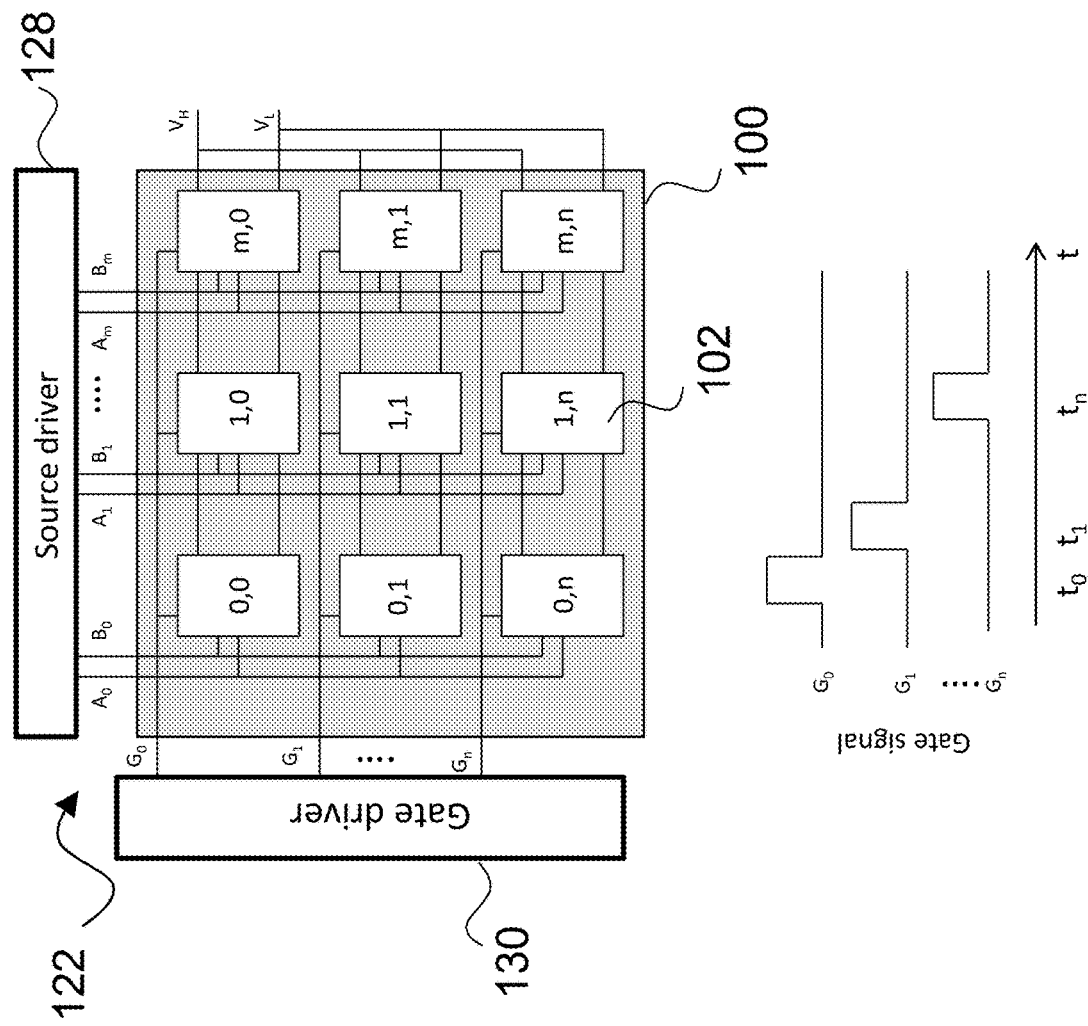

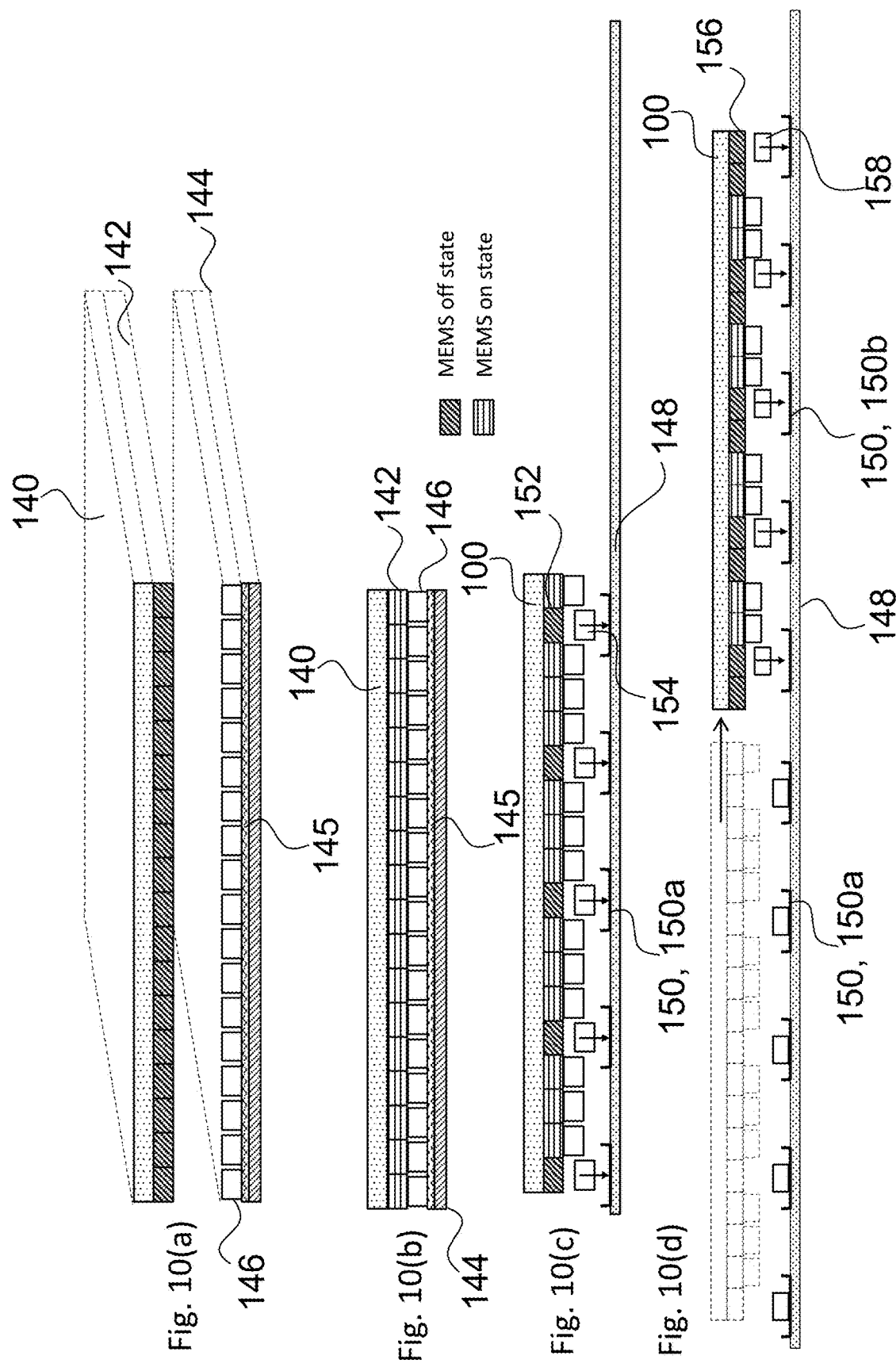

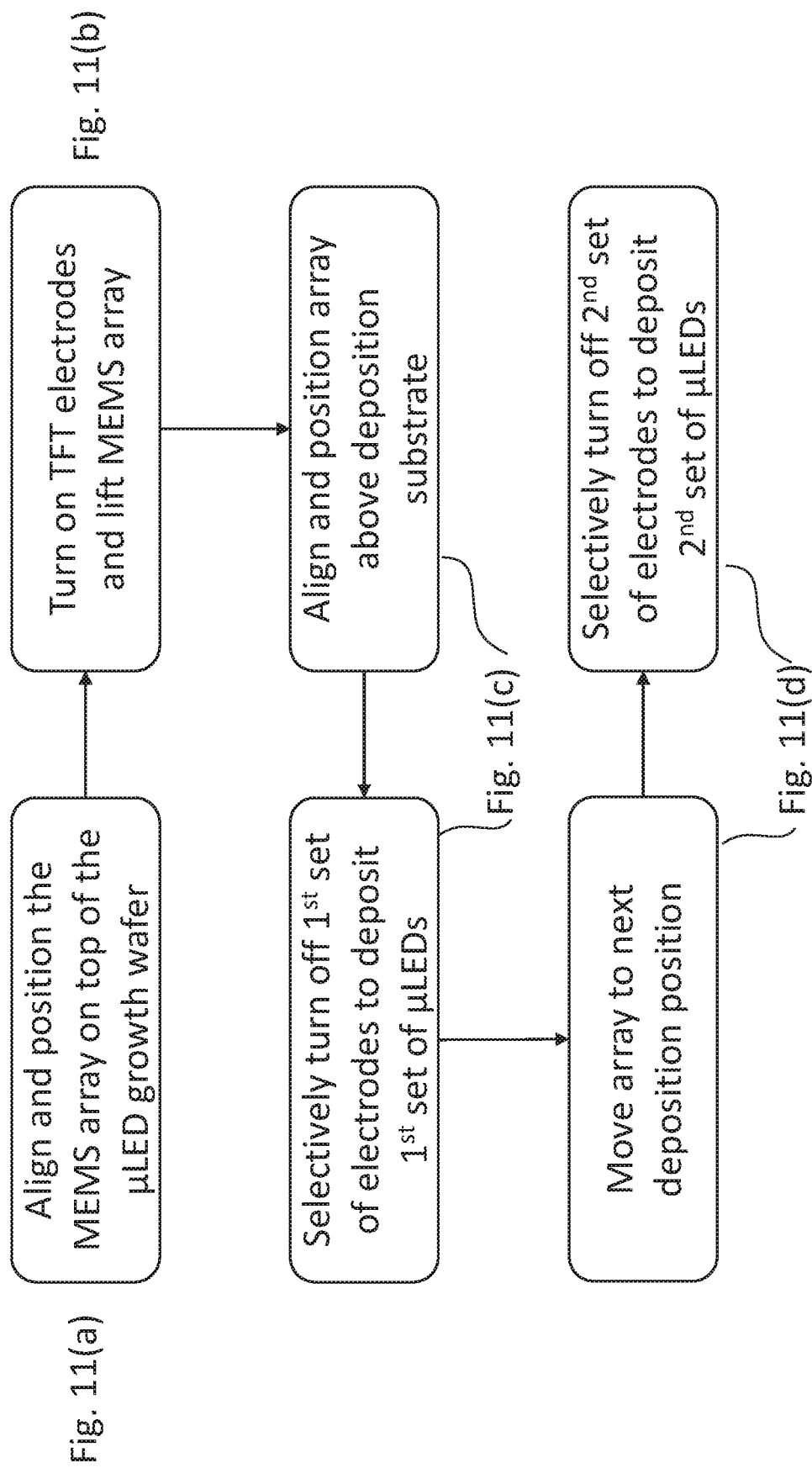

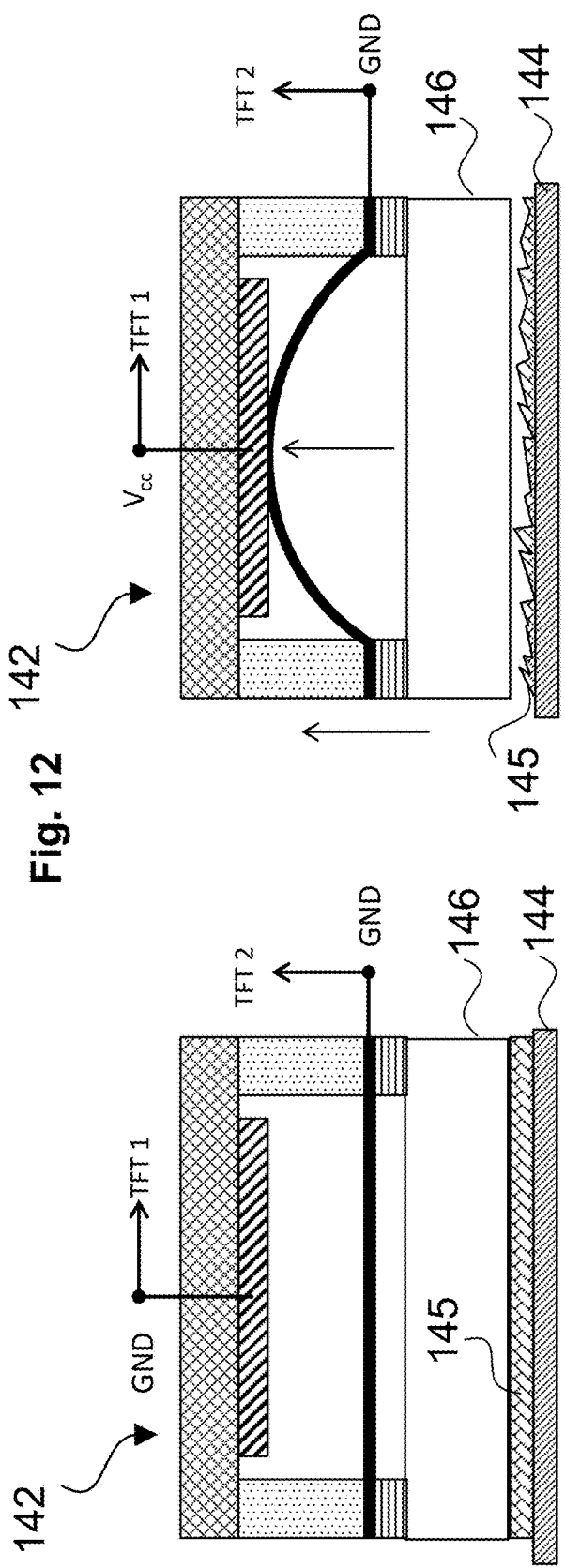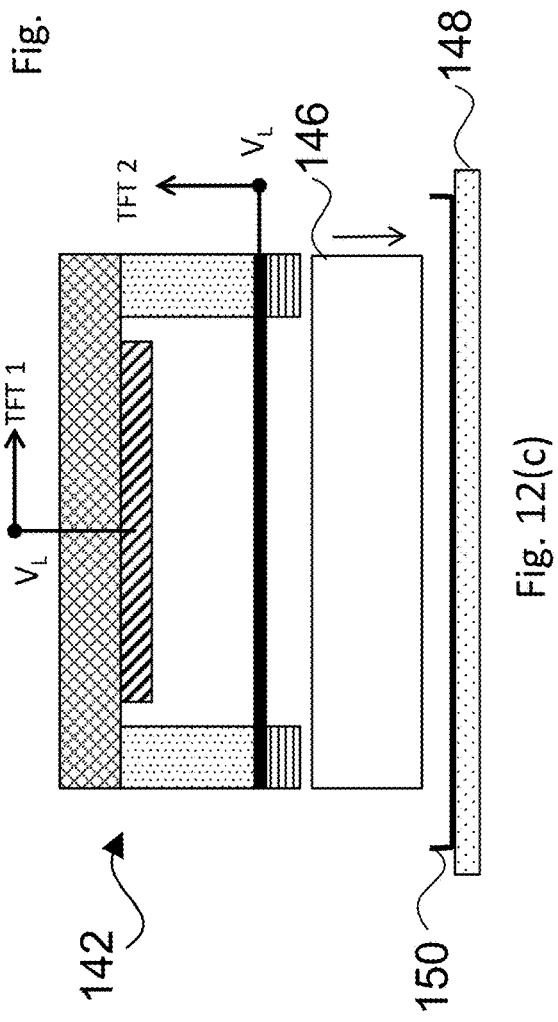

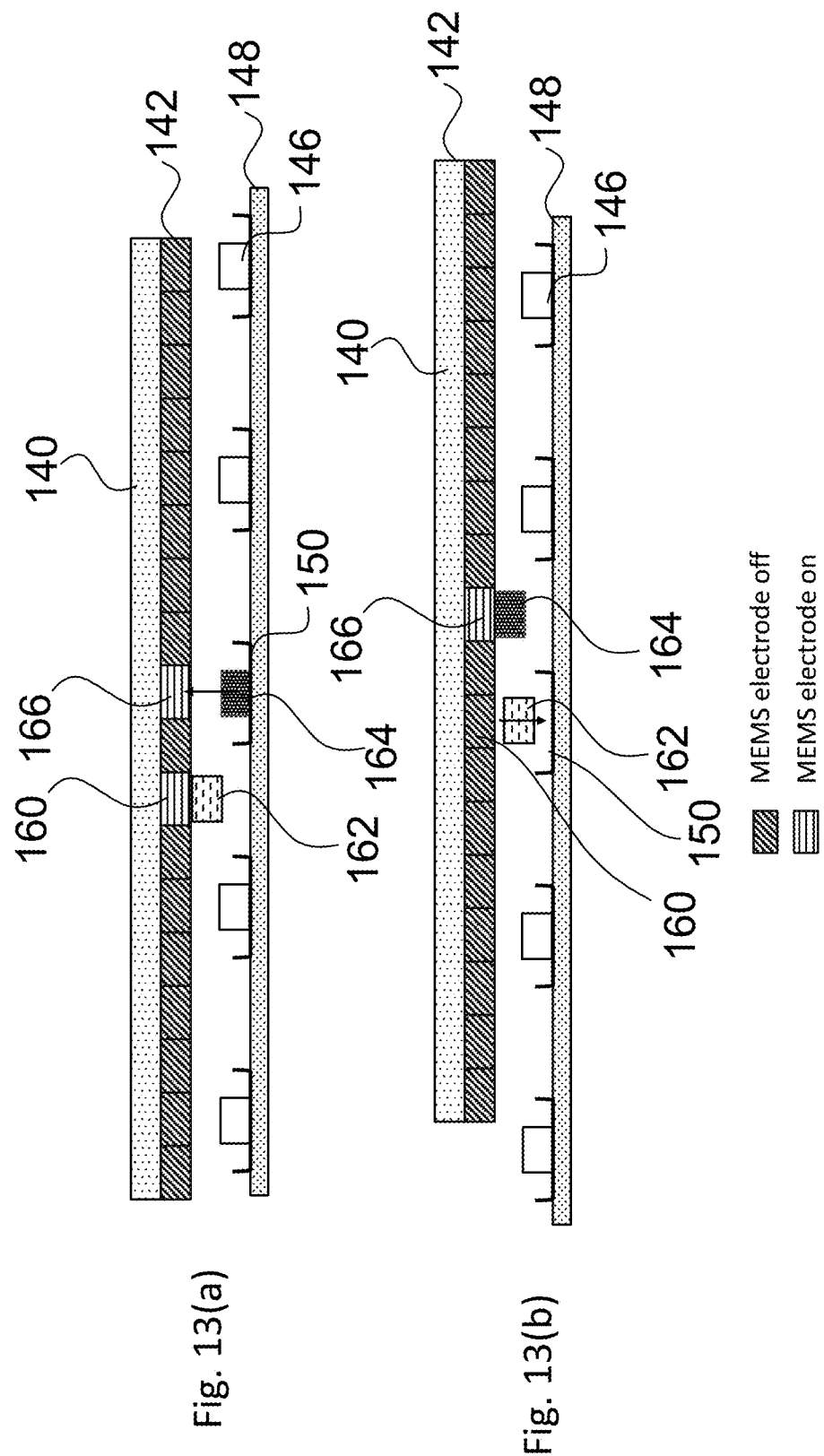

Fig. 16
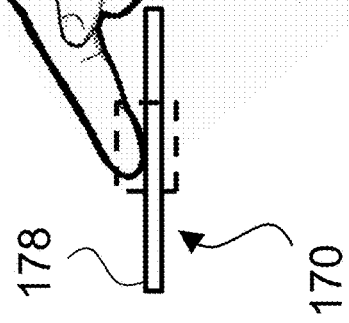
Fig. 16(a)
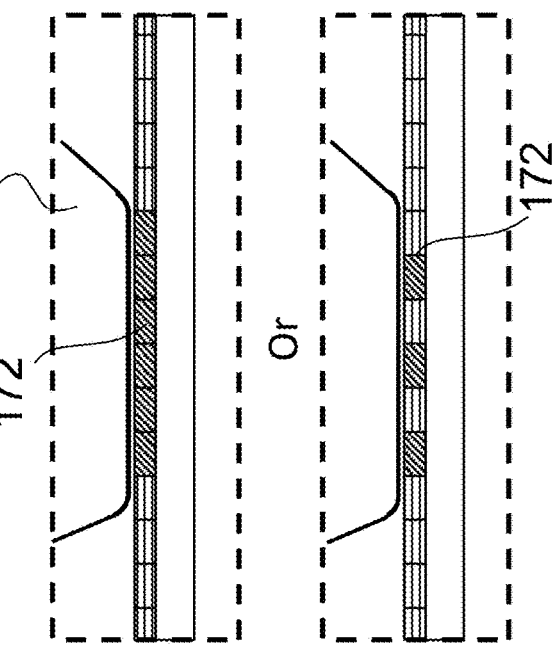
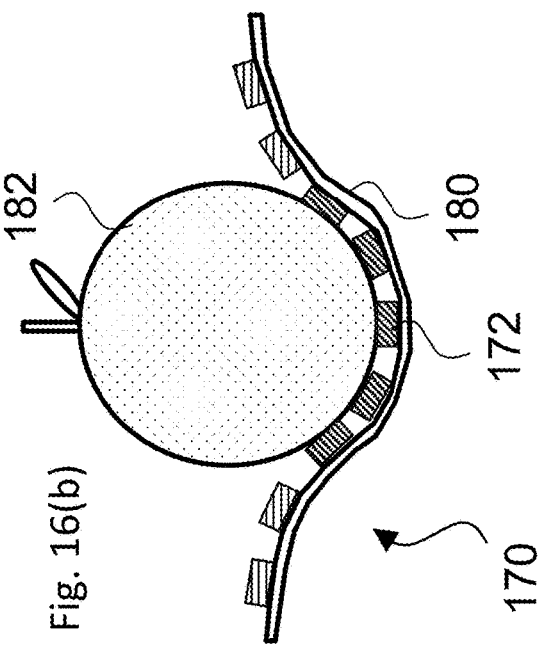
Fig. 16(c)
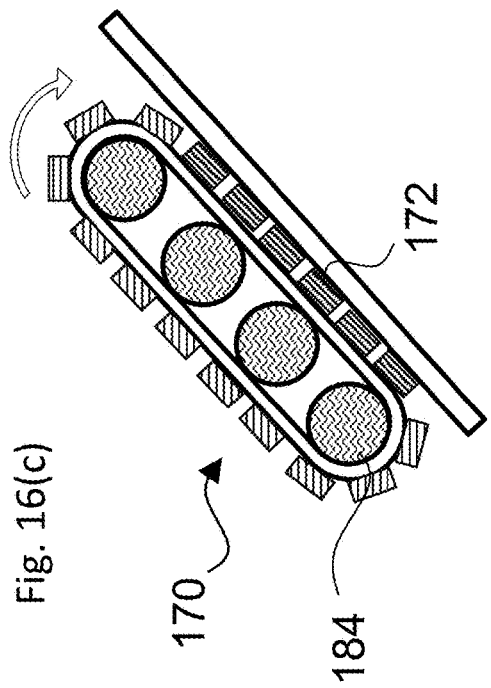
Fig. 16(b)

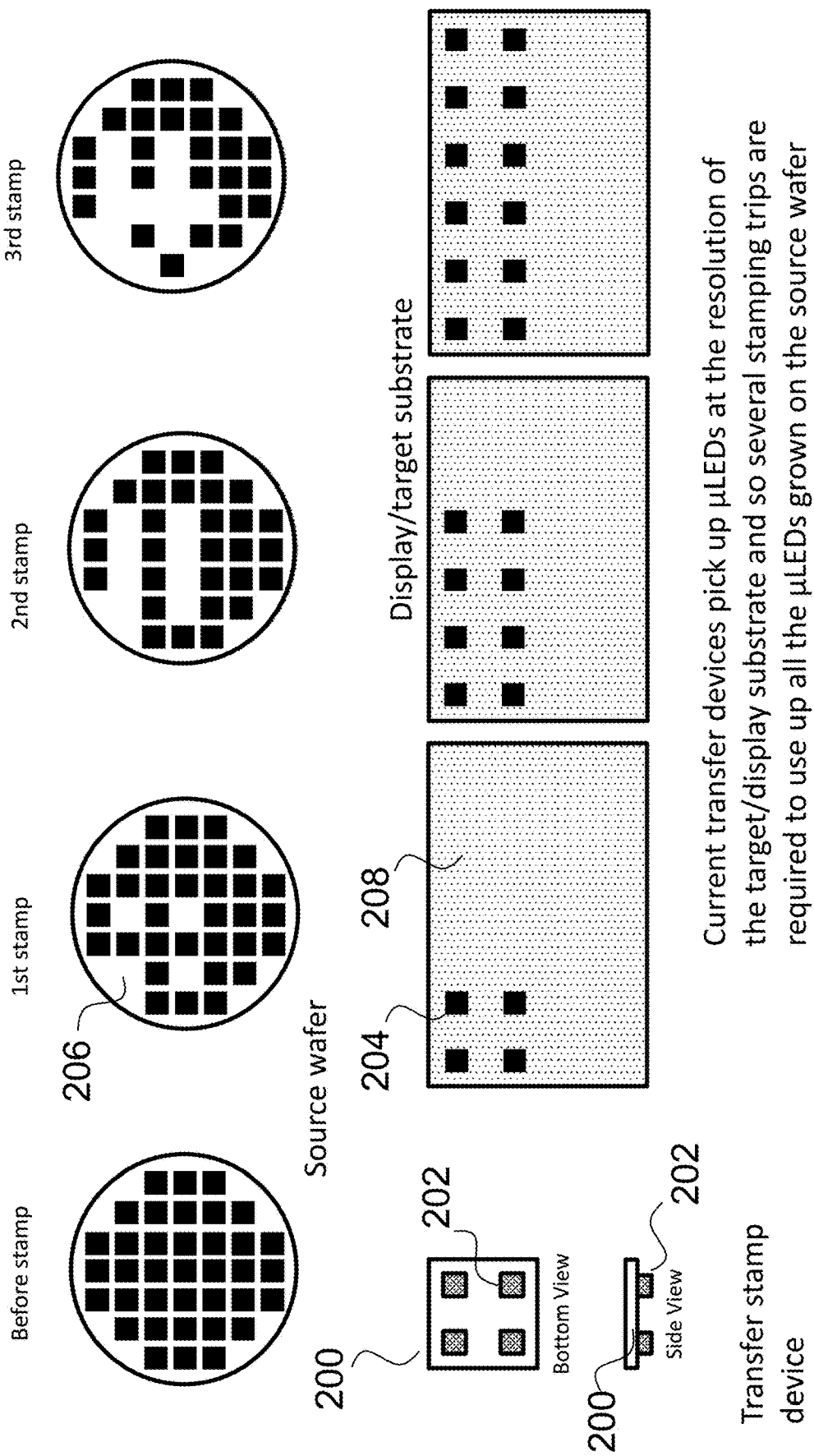
Fig. 17 -- Conventional Art

MEMS ARRAY SYSTEM AND METHOD OF MANIPULATING OBJECTS

TECHNICAL FIELD

The present invention relates to an object transfer device comprising an array of micro-electromechanical system (MEMS) elements capable of manipulating objects. Furthermore, the invention relates to a pick-and-place transfer method of moving microscale objects, such as micro light emitting diodes (µLEDs), from a source substrate to a target substrate, and related object transfer methods using a MEMS array.

BACKGROUND ART

An advanced display technology employs the use of micro light-emitting diodes (µLEDs). µLED display technology is expected to outperform OLED and potentially be one of the contenders to replace LCD display technology as the predominant display technology in the next decade. However, the development for mass production of µLED displays has reached a bottleneck due to complications with the mass transfer of µLEDs from a source substrate, such as a growth wafer, to the target display substrate. Transfer yields and efficiency are currently too low for mass production of large displays to be feasible. Large displays, such as tablets or televisions, require millions of µLEDs to be transferred from the source wafer onto the display substrate, and with transfer yields less than 100%, dead pixels are becoming a significant issue in manufacturing a display with the requisite number of µLEDs.

One of the leading pick and place devices used for transferring µLEDs is an elastomeric stamp, such as the stamp and transfer method described in WO 2016/012409 (Bower et al., published Jan. 28, 2016). The device includes a polymer stamp that has a rate-dependent adhesion property allowing µLEDs to be picked up and placed down by varying the speed at which the stamp is moved. WO 2016/116889 (Chaji et al., published Jul. 28, 2016) describes a method of a direct transfer between a donor substrate and a receive substrate via employing a combination of attractive, repulsive and weakening forces. WO 2013/119671 (Bibl et al., published Aug. 15, 2013) discloses a stamp-like transfer head that operates to pick up and place micro devices using electrostatic forces.

FIG. 17 is a drawing exemplifying these conventional stamp-based methods, such as using an elastomeric stamp or electrostatic stamp transfer head. FIG. 17 depicts a stamp 200 of a having an array of a plurality of transfer heads 202. The stamp 200 picks up an array of micro devices 204 (e.g., µLEDs) from a source wafer 206, by operation of electrostatic, elastomeric, or other like forces applied via the transfer heads 202. The stamp 200 can then move the micro devices 204 and bond them to a display substrate 208. The micro devices 204 are released to deposit on the display substrate 208 by manipulating the associated forces.

As seen in FIG. 17, a resolution of the source wafer 206, i.e., the number of micro devices 204 per unit area, typically is significantly greater than a resolution of the display substrate 208. Both the electrostatic and the elastomeric stamps pick up a portion of the micro devices 204 from source wafer 206 at the resolution of the display substrate 208 to permit placement at the resolution of the display substrate 208. Accordingly, because the stamp can only pick up and release a common fixed number of elements at the same time, the stamp 200 must have the resolution of the target display substrate 208, and thus must make many trips between the growth wafer 206 and the display substrate 208. FIG. 17 illustrates three exemplary stamp passes, and the wafer must be repeatedly stamped in this fashion until the display device includes the requisite number of micro devices. This provides for an inefficient method of picking up and placing micro devices for µLED displays that require millions of µLEDs.

In a wholly separate field of technology, micro-electromechanical systems are microscopic devices with moving parts. The use of micro-electromechanical systems (MEMS) involving a flexible membrane, actuated by applying a potential difference between the membrane and an electrode, is well known. These flexible membrane MEMS have mainly been demonstrated in acoustic devices such as a MEMS microphone, or a MEMS ultrasound scanner (e.g., McMullen et al., GB 2469412, published Oct. 13, 2010), both of which involve the acoustic vibration of the flexible membrane.

Efforts in MEMS design have been focused on the design of suitable structures for acoustic generation as well as on the implementation of effective driving methods. For example, Digital Sound Reconstruction (DSR) theory, as described for example in Gabriel et al., US2003/0044029 (published on Mar. 6, 2003) offers low distortion and high linearity to sound production. To be effective, DSR requires a high number of identical speakers that can be individually controlled. Research efforts thus also have focused on the production of miniaturized devices with homogenous and well-tuned properties. In Loeb et al., U.S. Pat. No. 6,829,131B1 (issued Dec. 7, 2004), an acoustic transducer with a diaphragm formed on a single silicon chip using CMOS-MEMS technology is disclosed. With such configuration it is then possible to obtain higher integration and uniformity within an array of devices.

Cohen et al., U.S. Pat. No. 8,780,673B2 (issued Jul. 15, 2014) and Cohen et al., WO2014141258A1 (published Sep. 18, 2014) disclose an actuation system comprised of an array of identical elements constrained to move along one direction and actuated by electromagnetic and electrostatic forces respectively. The single elements are not individually controlled, and a driving method controlled by an active matrix is not disclosed.

In the literature, MEMS structures composed of electrostatically actuated membranes comprising multiple electrodes are reported in the field of RF switches and varactors. Examples of such devices are disclosed in Chou, US2006/0226501A1 (published Oct. 12, 2006), Lan et al., U.S. Pat. No. 8,363,380 (issued Jan. 29, 2013) and Breen et al., U.S. Pat. No. 8,849,087B2 (issued Sep. 30, 2014).

The above fields, however, have offered only limited uses of the capabilities of MEMS devices.

SUMMARY OF INVENTION

The present disclosure describes a system and methods that enable the transfer of a substantial batch of microscale objects, such as µLEDs, from a source substrate or wafer to a target substrate. The microscale objects are picked up in accordance with a resolution of the source substrate and are selectively redistributed at the desired resolution of the target substrate, making it far more efficient than current transfer devices and methods. The system is implemented as a TFT controlled MEMS array system that offers a far more versatile pick and place technique as compared to conventional configurations, with the further ability to replace individual dead pixels, effectively giving a total transfer yield of 100%. The MEMS array device operates to manipulate the microscale objects by generating forces with the MEMS elements by which each MEMS element acts on an individual microscale object via the actuation of a flexible membrane. One capability of flexible membrane MEMS, which has not been exploited before, is the generation of attractive forces on the micron scale by the flexing of the membrane. A flexible membrane MEMS can be used to create a form of suction force that can be used to manipulate or move microscale objects.

A field in which such micro-manipulation can be made applicable is the picking up and placing of microscale electronics. For example, micro-manipulation using MEMS attraction forces can be used to aid the assembly of small components on a printed circuit board (PCB). As another example, micro-manipulation using MEMS attraction forces can be used in the transfer of micro light emitting diodes (µLEDs) from a source substrate to a display or target substrate as referenced above. Micro-manipulation using MEMS attraction forces could also have applications in biology and chemistry for micro-precision manipulation of small objects such as cells or small amounts of chemicals.

The MEMS array system includes a two-dimensional array of MEMS elements by which a force is generated by each MEMS element by the actuation of a flexible membrane. In exemplary embodiments, the MEMS element includes a flexible membrane, an electrode configuration for actuating the flexible membrane, and a foot which, when positioned over an object being picked up, create a clearance region in the form of an air gap above the object. The presence of the clearance region provides clearance space to flex the membrane, and also prevents the membrane from being easily damaged. The flexible membrane may be anchored to a casing structure, which may be made of a common MEMS material such as polysilicon. A voltage may be applied across the flexible membrane through an electrode configuration to control the actuation.

The MEMS element may be used to act upon a microscale object via the following process. The MEMS element, in the off state, is positioned above the object, and the foot of the MEMS element is placed on a flat surface of the object, leaving the clearance region air gap between the object and the flexible membrane. The MEMS element is switched to the "on" state by applying a voltage difference across the electrode configuration to deflect the membrane upwards, which reduces the pressure in the clearance region. This reduction in pressure relative to the ambient air pressure creates a suction force acting on the object, and thus the object is retained to the MEMS element by action of the suction force resulting from the negative pressure. At this point the MEMS element may perform a manipulation action on the object, such as picking the object up and moving the object. When the MEMS element is switched to the "off" state by removing the voltage difference across the electrode configuration, the membrane returns to its non-flexed state and the suction force is removed, allowing the object to be released.

A MEMS array system includes a MEMS array having a plurality of MEMS elements configured in a two-dimensional (2D) array, in which each element of the 2D array is an individual MEMS element as described above. Each element of the 2D array is capable of acting upon a respective microscale object, or acting upon a respective area of a larger macroscale object, via the application of the MEMS suction forces as referenced above.

The MEMS array system including the 2D MEMS array further includes a control circuit and a sensing circuit. Signals sent to the control circuit may be sent by a system controller. The system controller also may receive signals from the sensing circuit. The control circuit may be a thin-film transistor (TFT) circuit that can send signals to individual MEMS elements of the 2D MEMS array allowing for selective actuation of the MEMS elements. The sensing circuit may enable capacitive sensing whereby a capacitive sensing circuit is configured to enable a system controller to determine whether or not an object has been successfully picked up or put down by capacitively sensing the presence of the object. In a similar way, the capacitive sensing circuit may be used to determine if each MEMS element is actuating properly, i.e. each MEMS element can be individually checked.

In one aspect of the invention, the MEMS array system is employed to perform a method for transferring microscale objects, such as µLEDs, from a source (wafer) substrate to a target (display) substrate. µLEDs are grown on the source wafer and need to be transferred from the source wafer to the display substrate to which the µLEDs are to be bonded. A MEMS array system with a 2D MEMS array can be configured such that a resolution of the MEMS array matches a resolution of a µLED source wafer, so that when the MEMS array is positioned on top of the µLED source wafer the MEMS array can pick up the entire array of µLEDs on the source wafer in one step due to the matched resolution. The MEMS array can then selectively deposit the µLEDs at the resolution of the target substrate by selectively controlling each MEMS element to release a respective µLED at a proper location on the target substrate.

An aspect of the invention is a micro-electro-mechanical systems (MEMS) array system configured to apply suction forces for the manipulation of objects. In exemplary embodiments, the MEMS system includes a two-dimensional MEMS array of a plurality of individual MEMS elements arranged in an array of N rows and M columns with N and M being integers greater than or equal to one. Each MEMS element comprises: a casing structure; a flexible membrane attached to the casing structure; and an electrode structure, wherein a voltage applied to the electrode structure actuates the MEMS element to cause the flexible membrane to flex relative to the casing structure; wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object. The MEMS array system further includes a control circuit configured to selectively actuate one or more of the MEMS elements of the MEMS array.

Another aspect of the invention is a method of manipulating one or more objects using the micro-electro-mechanical systems (MEMS) array system according to any of the embodiments. In exemplary embodiments, the method includes steps of: providing the a two-dimensional MEMS array as detailed above; placing the MEMS array against the one or more objects to be manipulated; electronically selecting one or more of the MEMS elements for actuation; applying a voltage to the electrode structure of the selected MEMS elements to place the selected MEMS elements in an on state in which the flexible membranes of the selected MEMS elements flex from an initial position to a flexed position relative to the casing structure, whereby the selected MEMS elements generate a suction force against the one or more objects by the flexing of the flexible membranes; and retaining the one or more objects to the MEMS array by operation of the suction forces to perform a manipulation of the one or more objects.

The one or more objects may be one or more microscale objects, the method further comprising: using the suction forces of the selected MEMS elements such that each selected MEMS element lifts a respective microscale object from a first surface; moving the location of the MEMS array while the suction force retains the one or more microscale objects to the respective MEMS elements; and removing the suction force and releasing the one or more microscale objects from the respective MEMS elements, thereby placing the one or more microscale objects on a second surface. Such method may be used, for example, to transfer one or more μLEDs from a source substrate having a first resolution of μLEDs per unit area, to a display substrate having deposition areas at a second resolution different from the first resolution. Such method also may be used to replace a malfunctioned individual μLED from a display substrate with a functional μLED obtained from a source substrate.

The one or more objects alternatively may be a macroscale object that spans a plurality of the selected MEMS elements, the method further comprising using the suction forces of the selected MEMS elements such that multiple MEMS elements apply a combined suction force to manipulate the macroscale object. Such method may include varying a total suction force generated by the MEMS array by varying a proportion of the selected MEMS elements relative to all the MEMS elements in the MEMS array To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 3 is a drawing depicting an exemplary method of manipulating an object using the MEMS element in accordance with embodiments of the present invention, with FIGS. 3(a), 3(b), 3(c), and 3(d) depicting different stages of object manipulation.

FIG. 4 is a drawing depicting another exemplary MEMS element in accordance with embodiments of the present invention, with FIGS. 4(a), 4(b), and 4(c) depicting manipulations of different sized objects with the MEMS element.

FIG. 5a and FIG. 5b are schematic drawings depicting exemplary TFT drive circuits for driving a MEMS element in accordance with embodiments of the present invention.

FIG. 6 is a chart depicting an operational state of the MEMS element in accordance with voltages being applied to the TFT drive circuit of FIG. 5.

FIG. 7 is a drawing depicting an exemplary 2D MEMS array in accordance with embodiments of the present invention.

FIG. 8 is a drawing depicting an exemplary MEMS array system in accordance with embodiments of the present invention, which includes a MEMS array comparable to that of FIG. 7.

FIG. 9 is a drawing depicting driver circuitry of a control circuit by which particular MEMS elements and/or groups of MEMS elements in a MEMS array are electronically selected for actuation and control.

FIG. 10 is drawing depicting a method of transferring an array of microscale objects using a MEMS array, with FIGS. 10(a), 10(b), 10(c), and 10(d) illustrating the different states of the MEMS array during the transfer method.

FIG. 11 is a flow chart diagram depicting corresponding steps of the transfer method performed by the device of FIG. 10, with FIGS. 11(a), 11(b), 11(c), and 11(d) (corresponding to states (a)-(d) of FIG. 10) setting forth the different steps of the transfer method.

FIG. 12 is a drawing depicting a close-up view of the operation of a MEMS element when a breakaway layer bonding a microscale objected is utilized, with FIGS. 12(a), 12(b), and 12(c) depicting different stages of object manipulation.

FIG. 13 is drawing depicting a method replacing an individual microscale object using a MEMS array, with FIGS. 13(a) and 13(b) illustrating the different states of the MEMS array during the replacement method.

FIG. 16 is a drawing depicting force control of the MEMS array using multiple MEMS elements to manipulate macroscale objects, with FIGS. 16(a), 16(b), and 16(c) showing examples of manipulations of different objects.

FIG. 17 is a drawing exemplifying conventional stamp-based methods of transferring microscale objects from a source substrate to a target substrate.

DESCRIPTION OF EMBODIMENTS

Figure 1:
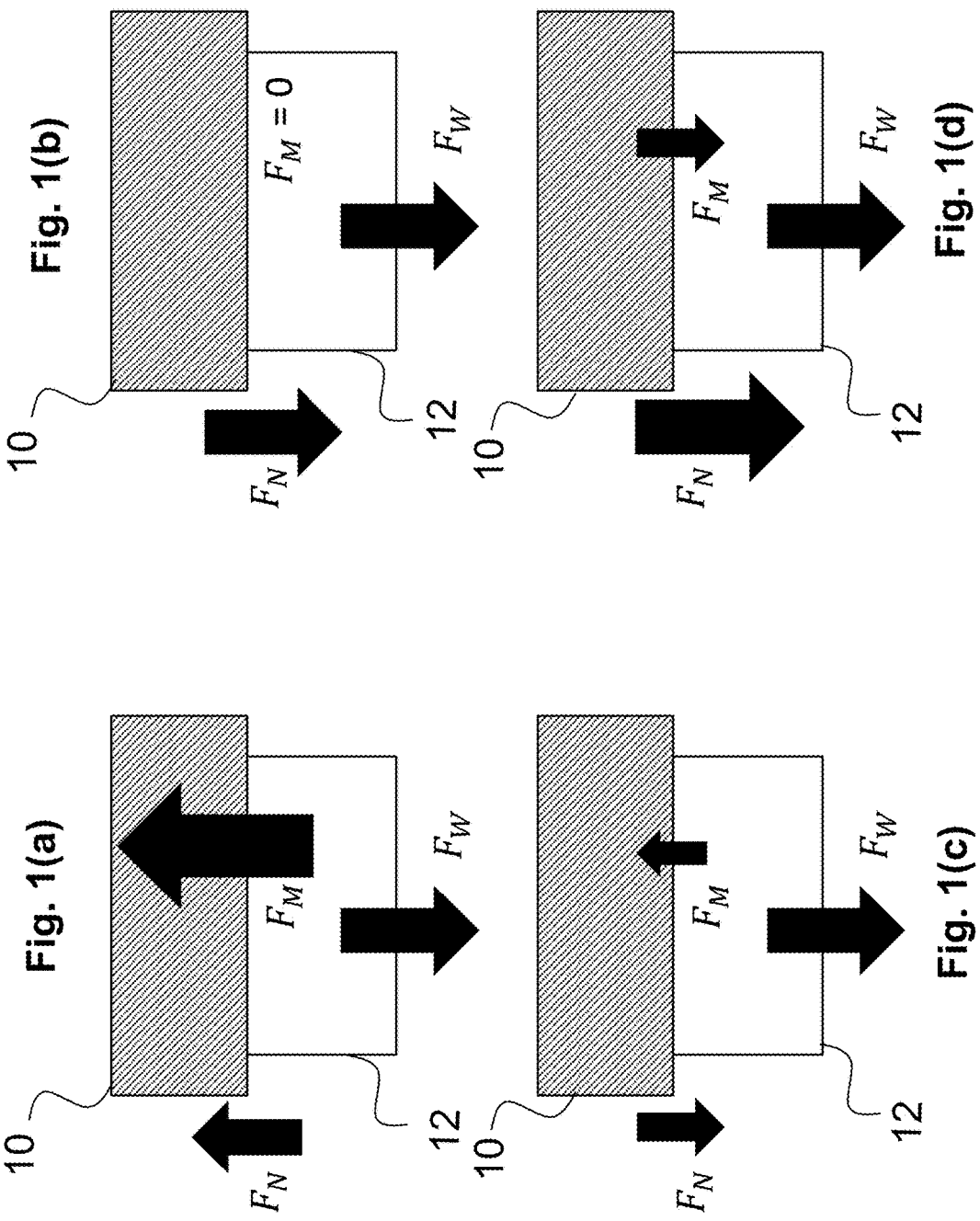
FIG. 1 is a generalized drawing depicting forces that a MEMS element can exert upon a microscale object, with FIGS. 1(a), 1(b), 1(c), and 1(d) depicting different actuation states of the MEMS element.

Embodiments of the present invention will now be described with reference to the drawings, wherein like reference numerals are used to refer to like elements throughout. It will be understood that the figures are not necessarily to scale.

The present invention provides a MEMS array system that includes a MEMS array having a plurality of individual MEMS elements for the manipulation of microscale objects. FIG. 1 is a generalized drawing depicting forces that an individual MEMS element 10 can exert upon a microscale object 12, showing the MEMS element 10 in different states of actuation. The MEMS element 10, when actuated creates a force $F_M$ that acts on a microscale object 12. The target on which the MEMS element is acting is referred to herein generally as the "object", which may include various types of microscale objects as further detailed below. The effect of the MEMS force $F_M$ on the object is dependent on the net force $F_N$ of the system, which generally is dependent on how the MEMS force $F_M$ compares with the weight $F_W$ of the object. For the description below, unless stated otherwise it is assumed that these are the main two forces acting in the system; however other external forces may be present in certain uses. Accordingly, more generally the effect of the MEMS element is in accordance with the net force $F_N$ of the system, which is a net force of the MEMS force $F_M$ and a vector sum of external forces, which may include the weight $F_W$ of the target object.

FIG. 1 depicts a simplified example in which the weight $F_W$ of the object 12 is the only non-negligible external force. In portion FIG. 1(a), the MEMS element is placed in an "on" state such that an MEMS force $F_M$ is generated that exceeds the object weight $F_W$. Accordingly, the net force $F_N$ is in the direction of the MEMS force. In such state, an attractive force is applied to the object that may be used to lift the object and move the object to another location. In portion FIG. 1(b), the MEMS element is placed in an "off" state such that the MEMS force $F_M$ is removed. Accordingly, the net force $F_N$ is in the direction of the object weight $F_W$. In such state, no suction force is applied to the object and the object may not be retained by the MEMS element. Progressing through FIG. 1(a) and FIG. 1(b) illustrates how the object can be picked up (and moved to another location if desired) by actuating the MEMS element to the "on" state, and then releasing the object by de-actuating the MEMS element to the "off" state.

In portion FIG. 1(c), the MEMS element is placed in an "on" state such that a MEMS force $F_M$ is generated that does not exceed the object weight $F_W$. Accordingly, the net force $F_N$ is in the direction of the object weight $F_W$. FIG. 1(c) illustrates that the MEMS force must be sufficient to overcome opposite external forces to manipulate an object, such as for example the weight of the object. In such state, therefore, the suction force applied to the object is not sufficient to lift the object. Progressing through FIG. 1(a) and FIG. 1(c) illustrates how the object can be picked up (and moved to another location if desired) by actuating the MEMS element to the "on" state, and then releasing the object by reducing the MEMS force below the object weight so that the net force F is in the direction of the object weight $F_W$, releasing the object. This operation may be employed, for example, to provide a more controlled release of the object.

In portion FIG. 1(d), the MEMS element is placed in a "repel" state such that a MEMS force $F_M$ is generated in the same direction as the object weight $F_W$. Accordingly, the MEMS force is a repulsive force against the object tending to push the object away from the MEMS element. The net force $F_N$ is in the direction of the object weight $F_W$ and is of a higher magnitude as the net force is a sum of the object weight and the repulsive MEMS force. In such state, therefore, a repulsive force is applied to the object to achieve a strong release of the object. Progressing through FIG. 1(a) and FIG. 1(d) illustrates how the object can be picked up (and moved to another location if desired) by actuating the MEMS element to the "on" state, and then releasing the object by actuating the MEMS element to the "repel" state with a repulsive force so that the net force $F_N$ is stronger in the direction of releasing the object than by simply de-actuating the MEMS element to the "off" state. This operation may be employed, for example, to provide a different type of controlled release of the object by positively pushing the object away from the MEMS element.

Generally, therefore, the MEMS element 10 is capable of generating either an attractive force or a repulsive force when placed in contact with a microscale object 12. In a simple picking up and placing down example, if the attractive force is greater than the weight of the object, this allows the object to be picked up and moved to another location as desired. If the attractive force of the MEMS element is reduced to less than that of the object's weight, the microscale object can be placed down. If the force created by the MEMS element is repulsive, the object will be more positively pushed away from the MEMS element.

A micro-electro-mechanical systems (MEMS) element has a flexible membrane that creates a suction force by flexing to permit manipulation of a microscale object. In exemplary embodiments, the MEMS element includes a casing structure; a flexible membrane attached to the casing structure; and an electrode structure, wherein a voltage applied to the electrode structure causes the flexible membrane to flex relative to the casing structure; wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object. The electrode structure may include a first electrode located on the casing structure and a second electrode associated with the flexible membrane.

Figure 2:
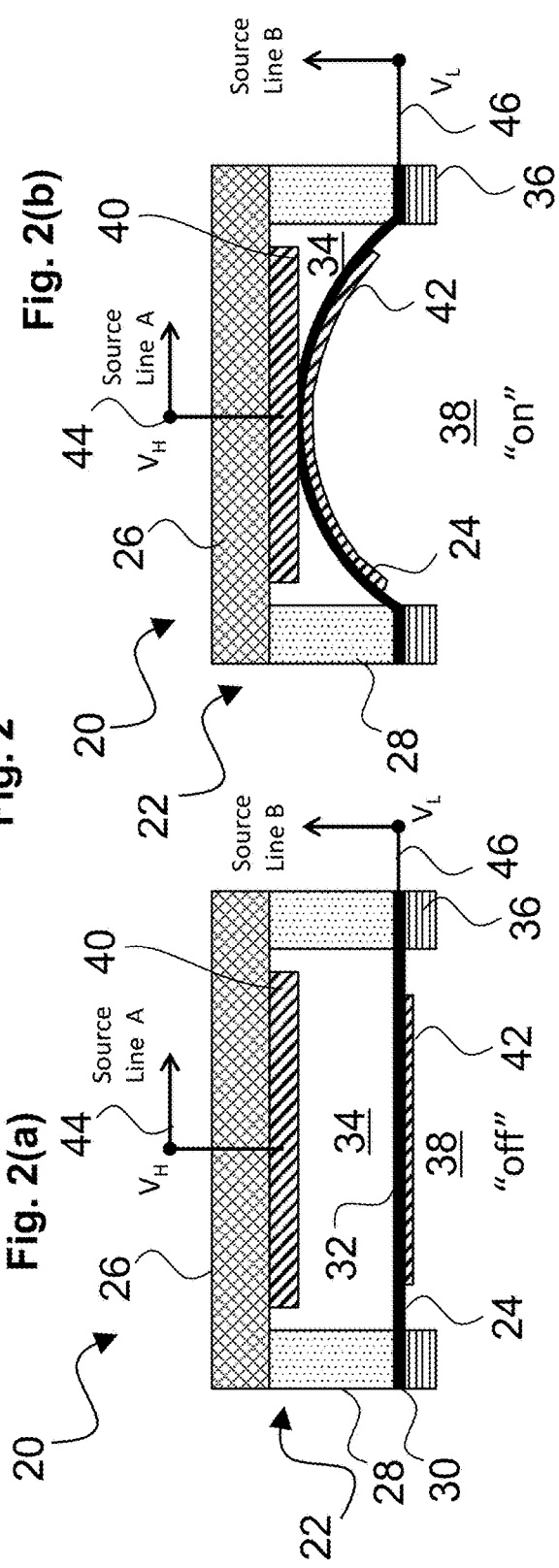
FIG. 2 is a drawing depicting an exemplary MEMS element in accordance with embodiments of the present invention, with FIGS. 2(a), 2(b), and 2(c) depicting different actuation states of the MEMS element.

FIG. 2 is a drawing depicting an exemplary MEMS element 20 in accordance with embodiments of the present invention, and showing the MEMS element 20 in different states of actuation. MEMS element 20 generates the MEMS force referenced above by actuation of a flexible membrane. The MEMS element 20 includes a casing structure 22 into which there is anchored a flexible membrane 24. In the example of FIG. 2, the casing structure 22 is formed of a plurality of separate components. The casing structure components may include a substrate 26 and a casing wall 28 that extends from the substrate 26. The substrate 26 may be made of a variety of rigid plastic materials or the like, including for example silicon, polysilicon, nitride or a flexible polymer. The casing wall 28 may be made of a comparable material as the substrate, and may be made of the same material or a different material as the substrate, and polysilicon is particularly suitable for the casing wall. In addition, although the substrate 26 and casing wall 28 are shown as separate components, they may be formed as a unitary or single piece of a same material.

The membrane 24 may be made of a comparable material as the components of the casing structure 22, and sufficiently thin so as to be rendered flexible. Polysilicon likewise is a particularly suitable material for the membrane 24. The membrane 24 includes an end anchor portion 30 and a more central flexing portion 32. The membrane 24 is deposited onto the casing wall 28 with the membrane being fixed at the anchor portion 30 to the casing wall 28 opposite from the substrate 26. The flexing portion 32 extends out of contact with the casing wall 28 to permit flexing of the flexing portion 32. As seen in FIG. 2, the membrane 24 and the casing structure 22 define a gap 34 into which the flexing portion 32 of the membrane may flex when the MEMS device is actuated.

The membrane 24 further is anchored in place by a foot 36 that extends from the flexible membrane in a direction away from the casing structure. The foot 36 is deposited on the anchor portion 30 of the membrane 24 so that the anchor portion 30 is securely fixed between the casing wall 28 and the foot 36. The foot 36 may be made of a material comparably as the material of the casing wall 28 and/or substrate 26, and suitable materials include, for example, polysilicon and polydimethylsiloxane (PDMS). The foot 36 also may include an adhesive material so as to adhere to an object to be manipulated. The adhesive material may be incorporated generally into the foot material, such as by forming the foot using a polymer material having adhesive properties. Alternatively, the foot may include an adhesive layer or film on a surface of the foot that contacts the object to be manipulated. Positioning of the foot 36 results in the foot and the flexible membrane defining a clearance region 38 on an opposite side of the membrane 24 from the gap 34. As further detailed below, when the MEMS element 20 interacts with an object, the foot 36 spaces the membrane 24 apart from the object to be manipulated by an amount of the clearance region 38. The presence of the clearance region 38 makes it easier to flex the membrane and also prevents the membrane from being easily damaged.

The MEMS element 20 further may include an electrode structure for applying a voltage to the MEMS element 20. In an exemplary embodiment, a configuration of the electrode structure may include a first electrode located on the casing structure 22 and a second electrode located on the membrane 24, for actuating the MEMS device 20, particularly by flexing the membrane 24. Voltages applied to the first and second electrodes cause the flexible membrane to flex relative to the casing structure, as described in more detail below. The electrode configuration may include a first electrode 40 located on the substrate 26 of the casing 22 (also referred to as a casing electrode), and a second electrode 42 located on the membrane 24 (also referred to as a membrane electrode). The membrane electrode 42 may be deposited on or incorporated within or as part of the membrane 24. For simplicity of the drawings, therefore, the membrane electrode 42 is omitted from some of the subsequent drawings, although it will be appreciated that a membrane electrode is electrically associated or connected in some fashion to the MEMS device in association with the membrane 24 so as to be able to actuate and flex the membrane. Voltages are applied to the casing electrode 40 and the membrane electrode 42 to generate a potential difference between the substrate 26 and the membrane 24, which can cause the membrane to flex relative to an unactuated initial position of the membrane. For applying the voltages, the casing electrode 40 is electrically connected to a first voltage source line 44 (referred to as source line A), and the membrane electrode 42 is electrically connected to a second voltage source line 46 (referred to as source line B). The electrodes are made of any suitable metal material or other conductive material (such as a metal alloy for example) known in the art for electrode applications. In addition, although a two-electrode configuration is suitable, in another exemplary embodiment the electrode structure may include only a single electrode applied to the casing structure, as shown in some of the subsequent figures.

The portions of FIG. 2 illustrate the MEMS element 20 in different states of actuation. As further detailed below, when voltages are applied to the first and second electrodes in a manner that renders the electrodes oppositely charged, the flexible membrane is in an "on" state and flexes in a direction toward a substrate of the casing structure. When voltages are not applied to the first and second electrodes, the flexible membrane is in an "off" state and the flexible membrane does not flex relative to an initial position corresponding to when no voltage is applied to the flexible membrane. When voltages are applied to the first and second electrodes in a manner that renders the electrodes commonly charged, the flexible membrane is in a "repel" state and flexes in a direction away from the substrate of the casing structure In portion FIG. 2(a), no voltages are applied to the electrodes 40 and 42, and the MEMS device 20 is in an unactuated "off" state. In such state, the membrane 24 is at an initial position at which the membrane is positioned as anchored to the casing structure 22, i.e., the initial position is the membrane position in the "off" state corresponding to when no voltage is applied to the flexible membrane.

In portion FIG. 2(b), voltages are applied to the electrodes 40 and 42 via source line A and source line B, and the MEMS device 20 is in an actuated "on" state. The term "actuated state" or "on" state refers to the membrane flexing through the gap 34 towards the substrate 26 of the casing structure 22. This is accomplished by applying the voltages on the source lines to generate a potential difference between the substrate of the casing structure and the flexible membrane, whereby the flexible membrane becomes electrically attracted to the substrate. The result of said electrical attraction is that the membrane 24 flexes toward the substrate 26. FIG. 2(b) illustrates essentially a maximum state of flexion of the membrane 24 to generate a maximum suction force on the object. The voltages for source lines A and B, and therefore the level of attractive force and resultant flexion of the membrane, may be adjusted as is suitable to generate the desired flexion and resultant attractive MEMS force as described above with reference to FIG. 1(c).

In portion FIG. 2(c), voltages are applied to the electrodes 40 and 42 via source line A and source line B, and the MEMS device 20 is in a repel state. The term "repel state" refers to the membrane flexing through the clearance region 38 away from the substrate 26 of the casing structure 22. This accomplished by applying the voltages from the source lines to generate a potential between the casing structure and the flexible membrane whereby the flexible membrane becomes electrically repulsive from the substrate of the casing structure. The result of the electrical repulsion between the flexible membrane and the substrate is that the membrane 24 flexes away from the substrate 26. The voltages for source lines A and B, and therefore the level of repulsive force and resultant flexion of the membrane, also may be adjusted as is suitable to generate the desired flexion and resultant repulsive MEMS force comparably as with the "on" state.

FIG. 3 is a drawing depicting an exemplary method of manipulating an object using the MEMS element 20 in accordance with embodiments of the present invention, and showing different stages of object manipulation. FIG. 3 shows the MEMS element 20 in relation to a microscale object 50 to be manipulated that initially is located on a support surface 52. The support surface 52 may be any suitable surface for locating the object 50, such as a substrate material, table, electronic wafer material, or the like.

A method of manipulating an object is performed by manipulating the forces applied by the MEMS element. In exemplary embodiments, the method includes placing the MEMS element against the object to be manipulated; applying a voltage to the electrode structure to place the MEMS element in an on state in which the flexible membrane flexes from an initial position to a flexed position relative to the casing structure, whereby the MEMS element generates a suction force against the object by the flexing of the flexible membrane; and retaining the object to the MEMS element by operation of the suction force to perform a manipulation of the object. The method further may include removing the voltage from the electrode structure to place the MEMS element in an off state, whereby the flexible membrane returns to the initial position to remove the suction force. The method further may include applying a voltage to the electrode structure to place the MEMS element in a repel state in which the flexible membrane flexes from the flexed or initial position to an opposite flexed position relative to the on state, whereby the MEMS element generates a repulsion force against the object to release the object from the MEMS element.

Referring to FIG. 3, the MEMS element 20 may be used to act upon an object 50 via the following process, as illustrated in the portions of FIG. 3. In portion FIG. 3(a), the MEMS element 20 is in the "off" state, i.e., no voltages are applied to the electrodes so the membrane 24 is not flexed relative to the initial position. In such "off" state, the MEMS element 20 is positioned above the object 50. In a transition from portion FIG. 3(a) to portion FIG. 3(b), the foot 36 of the MEMS element is placed on a flat surface of the object 50, leaving the clearance region 38 between the object 50 and the flexible membrane 24. As depicted in portion FIG. 3(b), the MEMS element 20 is switched to the "on" state by applying voltages to the casing and membrane electrodes to generate an attractive force between the membrane and the substrate, thereby deflecting the membrane 24 though the gap 34 towards the substrate 26. This in turn results in a reduced pressure in the clearance region 38 relative to ambient pressure between the membrane 24 and the object 50. This reduction in pressure within the clearance region 38 relative to the ambient air pressure creates a suction force acting on the object 50, by which the object 50 is retained to the foot 36 of the MEMS element 20 via the negative pressure.

As depicted in portion FIG. 3(c), the MEMS element may perform a manipulation action on the object 50. In a basic manipulation action, the object 50 may be lifted off of or picked up from the support surface 52. The MEMS element 20 may then be moved to another location, and the MEMS force is retained to carry the object 50 along with the movement of the MEMS element 20. As depicted in portion FIG. 3(d), when the MEMS element is switched back to the "off" state (i.e., the voltages are removed from the electrodes), the membrane returns to its non-flexed initial position and the suction MEMS force is thereby removed. In absence of the suction MEMS force, the object 50 is released, allowing the object to be placed upon a support surface 52(a). With movement of the MEMS element 20 while the suction force is applied, the surface 52(a) may be a different location on the same support surface 52 from which the object 50 originated, or support surface 52(a) may be located on a wholly different structure from the support surface 52. In this manner, the MEMS element 20 may move microscale objects to different locations by application of the MEMS suction force.

When employed to pick up and move a microscale object, the design parameters of the MEMS element 20, such as for example, size, applicable electrode voltages, membrane flexing range, and the like may be set such that the actuation of the MEMS element creates enough MEMS suction force to be able to overcome the weight of the object desired to be picked up and moved. For example, a gallium nitride cube of sides 10 µm could be easily picked up by a MEMS element described above with a width of 10 µm and a membrane that is allowed to deflect upwards by 0.5 µm. The MEMS element 20 may be specially configured in this manner for manipulating a given microscale object.

Generally, therefore, a field in which such micro-manipulation can be made applicable is the picking up and placing of microscale electronics. For example, micro-manipulation using MEMS attraction forces can be used to aid the assembly of small components on a printed circuit board (PCB). As another example, micro-manipulation using MEMS attraction forces can be used in the transfer of micro light emitting diodes (µLEDs) from a source substrate to a display or target substrate. µLED technology is expected to outperform organic light emitting diodes (OLED) and liquid crystal display (LCD) technologies. Micro-manipulation using MEMS attraction forces could also have applications in biology and chemistry for micro-precision manipulation of small objects such as cells or small amounts of chemicals.

As referenced above, the foot 36 of the MEMS element 20 may include an adhesive material so as to adhere to the object 50 to be manipulated. The combination of adhesive properties of the foot 36 with the suction force of the MEMS element 20 provides an enhanced seal with the object 50 so that the MEMS suction force is more effective in retaining the object 50. If an adhesive material is incorporated into the foot 36, the object 50 might not be released when the membrane is returned to the non-flexed state of FIG. 3(d). In this embodiment, therefore, if the MEMS element were to be placed in the "off" state from the "on" state, the object still may be retained by the MEMS element by operation of the adhesive material. The MEMS element is therefore placed in the repel state to release the object from the MEMS element. Referring to FIG. 2, the MEMS element 20 is switched to the repel state of FIG. 2(c) (i.e., the source voltages render the membrane and casing electrodes to be like charges). By switching the MEMS element from the "on" state (or "off" state) to the "repel" state, the membrane 24 flexes in an opposite direction away from the substrate 26 into the clearance region 38. This in turn raises the air pressure within the clearance region 38 relative to ambient air pressure, which pushes the object off from the foot 36 of the MEMS element 20. In this manner, an adhesive foot provides a more stable retention of the object to the MEMS element during object manipulation, and the repel state then can be used to aid releasing the object in a more controlled manner.

FIG. 4 is a drawing depicting another exemplary MEMS element 54 in accordance with embodiments of the present invention, and further depicting manipulations of different sized objects with the MEMS element 54. MEMS element 54 bears similarities to the previous embodiments, and thus like components are afforded like reference numerals. The embodiment of FIG. 4 differs in that the extended foot 56 is provided that extends inward into the clearance region 38 relative to the casing wall 28.

With such configuration, the MEMS element 54 may act upon a range of different sized objects. Portion FIG. 4(a) shows that the foot 56 can interact against objects 50 comparable in size to the previous embodiment. In addition, as shown in portion FIG. 4(b), the extended foot 56 of the MEMS element 54 is configured such that objects 58 smaller than the dimensions of the MEMS element 54 can be manipulated, so long as some portion of the foot is in contact with the surface of the smaller object 58 to be picked up. This is achieved by the inward extending configuration of the foot 56 by which a portion of the foot overlaps with the central portion of the membrane 24. In addition, as shown in portion FIG. 4(c), objects 60 larger than the dimensions of the MEMS element 54 can be acted upon easily since the extended foot 56 will rest on a larger portion of the surface of the larger object 60 as compared to the previous embodiment.

The configuration of MEMS element 54 depicted in FIG. 4 may reduce the amount of suction force that can be generated by the MEMS element, insofar as the volume of the clearance region 38 is reduced by the use of the extended foot 56. Accordingly, the dimensions of the foot may be configured to properly balance or establish a useful trade-off of the force needs versus object size range for any particular application.

Figure 5A:
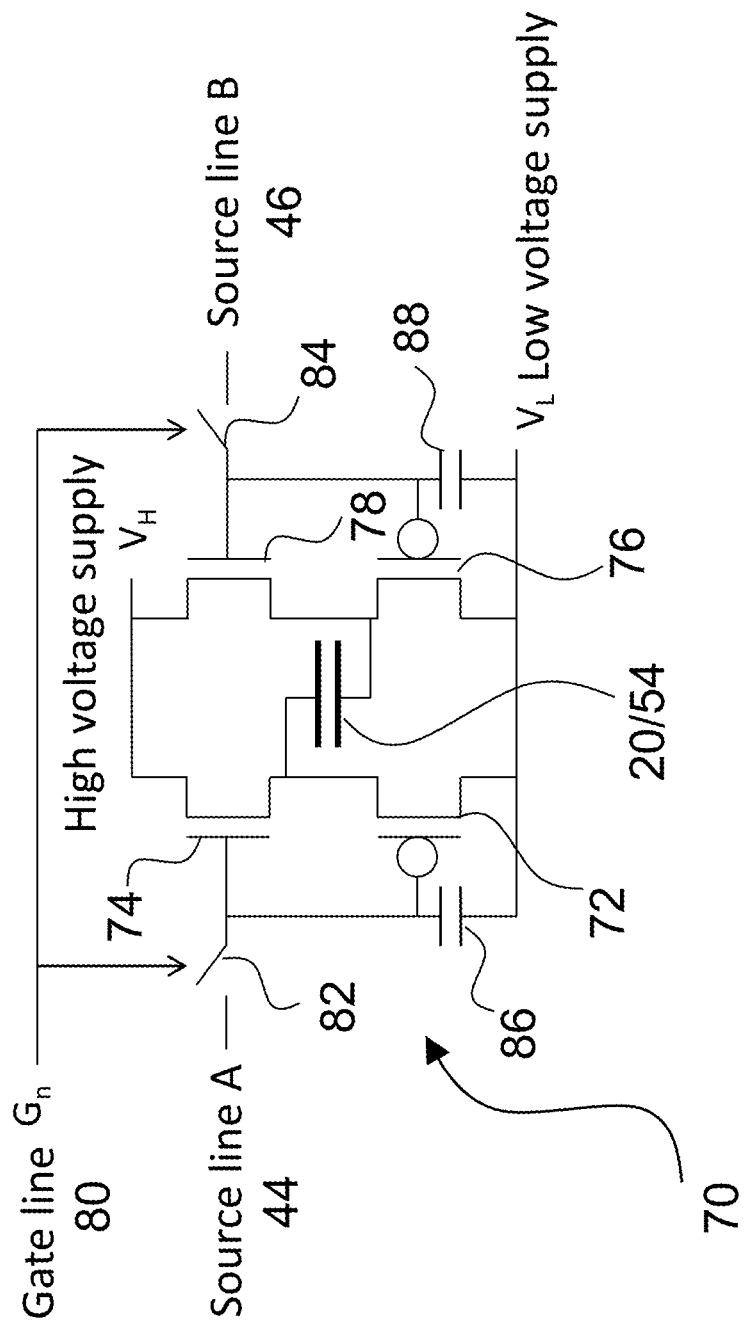

FIGS. 5a and 5b are schematic drawings depicting an exemplary TFT drive circuit 70 for driving a MEMS element 20/54 in accordance with embodiments of the present invention, which operates by controlling voltages applied to the first and second electrodes. As referenced above, source line A 44 is electrically connectable to the first (casing) electrode 40 of the MEMS element, and source line B 46 is connectable to the second (membrane) electrode 42 of the MEMS element.

The drive circuit 70 may include one or more transistors, which may be TFT transistors. In an exemplary implementation of the TFT drive circuit 70, source line A is connectable to a first p-type transistor 72 and a first n-type transistor 74 that are electrically connected to the first electrode of the MEMS element 20/54. Similarly, source line B is connectable to a second p-type transistor 76 and a second n-type transistor 78 that are electrically connected to the second electrode of the MEMS element 20/54. Each of the source lines A and B may be operated as a high voltage supply $V_H$ or a low voltage supply $V_L$, which may be external voltage supplies. It will be appreciated that a high voltage $V_H$ or a low voltage $V_L$ corresponds to a respective threshold voltage for switching the transistor elements, such that a transistor state will switch at any voltage of magnitude above $V_H$ or below $V_L$. The low voltage may be a ground voltage of 0 V. A gate line 80 ($G_n$) may be operated to close switches 82 and 84 to connect the respective source lines to the drive circuit 70 such that the voltages from the source lines may be applied to respective electrodes of the MEMS element. When multiple MEMS elements are configured in a two-dimensional array, the gate line 80 operates to select a row of MEMS elements, and connects the source lines to selected MEMS elements for actuation by application of the source line voltages.

The drive circuit further may include one or more memory elements for storing voltages applied to the first electrode and the second electrode. In the example of FIG. 5, the one or more memory elements includes a first capacitor 86 that stores a voltage applied to the first electrode, and a second capacitor 88 that stores a voltage applied to the second electrode. Capacitors 86 and 88 operate as DRAM memory storage elements so that the voltage remains applied to the MEMS element even after the gate line is switched off. This means the next row of elements can be addressed without losing the voltage states of the current row of elements. SRAM elements alternatively may be employed, although SRAM elements tend to be bulkier than DRAM elements, so DRAM elements would be preferred.

An alternative drive circuit arrangement is shown in FIG. 5b. With such configuration, each electrode may be supplied by a separate high voltage supply, and each high voltage supply may be switched between either a positive or negative voltage as desired.

Figure 6:
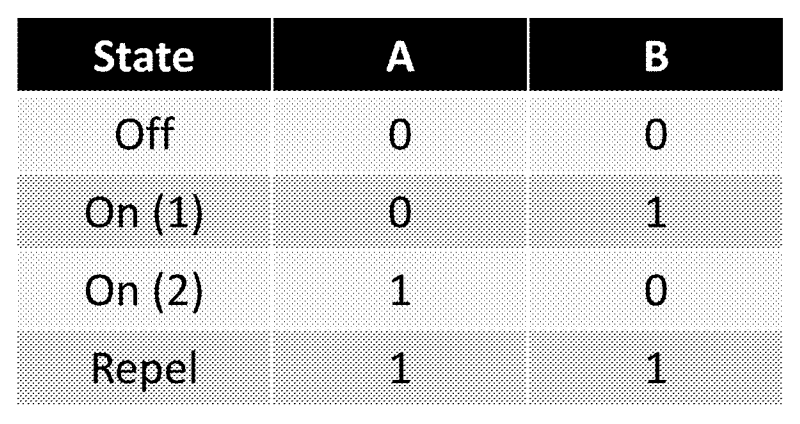

FIG. 6 is a chart depicting an operational state of the MEMS element in accordance with voltages being applied via the TFT drive circuit of FIG. 5a or FIG. 5b. In such chart, a "0" state is associated with a low voltage condition (e.g., voltage magnitude below the $V_L$ threshold), and a "1" state is associated with a high voltage condition (e.g., voltage magnitude above the $V_H$ threshold). As seen in the chart, when the source line voltages A and B are taken low, the MEMS element is the "off" state as no operating voltages are being applied to the MEMS element. When the source line voltages differ, e.g., source line A is low and source line B is high, or vice versa, the MEMS element is in the "on" state. In other words, with the source line voltages opposing high versus low, a potential difference is created to generate the attractive force to flex the MEMS membrane to generate the negative pressure suction force of the "on" state. Referring to the specific states identified in FIG. 6, the difference between the On(1) and On(2) states is the relative voltage applied to the electrodes, i.e., which electrode is high versus which electrode is low depending upon which source line is high versus which source line is low. In both states, however, the MEMS element is in the "on" state as the attractive force is generated by the potential difference between the flexible membrane and the substrate. When the source line voltages are both taken high, the MEMS element is in the "repel" state. In other words, the source line voltages being both high are applied to generate the repulsive force to flex the MEMS membrane to generate the positive pressure release force of the repel state.

A MEMS array system includes a MEMS array having a plurality of individual MEMS elements configured in a two-dimensional (2D) array, in which each element of the 2D MEMS array is an individual MEMS element configured comparably as described above in accordance with any of the embodiments. Each MEMS element of the 2D MEMS array is capable of acting upon a respective microscale object, or acting upon its own area of a larger macroscale object, via the application of the MEMS suction forces as detailed above. An aspect of the invention, therefore, is a micro-electro-mechanical systems (MEMS) array system configured to apply suction forces for the manipulation of objects. In exemplary embodiments, the MEMS array system includes a two-dimensional MEMS array of a plurality of individual MEMS elements arranged in an array of N rows and M columns with N and M being integers greater than or equal to one. Each MEMS element may be configured according to any of the embodiments of said MEMS elements. The MEMS array system further includes a control circuit configured to selectively actuate one or more of the MEMS elements of the MEMS array.

FIG. 7 is a drawing depicting an exemplary 2D MEMS array 100 in accordance with embodiments of the present invention. The 2D MEMS array 100 includes a plurality of individual MEMS elements 102 arranged in a 2D array having N×M MEMS elements, wherein N and M each is an integer greater than or equal to 1. For N and M, the term rows or columns often are used for purposes of illustration as corresponding to orientations depicted in the figures. Accordingly, it will be appreciated the principles of this disclosure are not dependent upon any particular orientation of the device, and thus "rows" may be "columns", and vice versa, depending upon how the device is oriented in space. The close-up view illustrates two exemplary adjacent MEMS elements 102(a) and 102(b) within the MEMS array. The individual MEMS elements generally may be configured comparably as any of the embodiments above for MEMS elements 20/54, and thus reference numerals are omitted for clarity but the components would generally correspond accordingly.

Certain structural modifications to the casing structure may be employed to arrange the individual MEMS elements into a 2D array. As seen in the example of FIG. 7, a unitary casing substrate 104 may be employed that spans multiple MEMS elements of the MEMS array, up to the entire the MEMS array, and adjacent MEMS elements may have a shared casing wall 106 that is sized to properly space the MEMS elements. The 2D MEMS array may be fabricated on a flexible or rigid casing substrate 104. The individual MEMS elements may be separated by designed separation distances by appropriately sizing the shared casing walls 106 across the MEMS array. In exemplary embodiments, there may be no separation between the feet and membranes of adjacent elements, and it may be simpler to fabricate the MEMS array with a f00t layer being deposited in one operation for the whole layer. The membrane may be separated between elements or may have no separation. Each MEMS element 102 may be the same size, or may be different sizes, as is suitable for any particular application. Individual voltage sources lines A and B are provided for each MEMS element, denoted respectively as A1/B1 and A2/B2 for the exemplary MEMS elements 102(a) and 102(b).

FIG. 8 is a drawing depicting an exemplary MEMS array system 120 in accordance with embodiments of the present invention, which includes the MEMS array 100. The MEMS array system 120 further includes a control circuit 122 and a sensing circuit 124. Signals sent to the control circuit 122 may be sent by a system controller 126, and the system controller also may receive signals from the sensing circuit 124. The control circuit 122 may be a thin-film transistor (TFT) array control circuit that can send signals to individual MEMS elements of the 2D MEMS array 100, allowing for electronic selective actuation and control of the individual MEMS elements 102. The sensing circuit 124 may enable capacitive sensing whereby a capacitive sensing circuit is configured to enable the system controller 126 to determine whether or not an object has been successfully picked up or put down by capacitively sensing the presence of the object. In a similar way, the capacitive sensing circuit 124 may be used to determine if each MEMS element 102 is actuating properly, i.e. each MEMS element can be individually checked.

As referenced above, the control circuit 122 may be implemented as a TFT array control circuit. FIG. 9 is a drawing depicting implementation of the control circuit 122 as a TFT array. Referring back to FIG. 5, each MEMS element 102 is controlled via the drive circuit 70. FIG. 9 illustrates additional driver circuitry of the control circuit 122 by which particular MEMS elements and/or groups of MEMS elements are electronically selected for actuation and control. In the example illustrated in FIG. 9, the individual MEMS elements 102 are designated by row/column number (N, M), wherein N is an integer $0 \rightarrow n$, and M is an integer $0 \rightarrow m$. Accordingly, each MEMS element is driven by source line voltages on a column basis corresponding to source line voltages A 44 and B 46 of FIG. 5, including a first voltage source line $A_{0 \rightarrow m}$ and a second voltage source line $B_{0 \rightarrow m}$. As referenced above, the voltages at the source lines may be set to a high voltage $V_H$ or a low voltage $V_L$.

In exemplary embodiments, the control circuit includes a source driver that applies drive signals to voltage source lines for applying voltages to the electrodes of the one or more MEMS elements, and a gate driver that applies gate signals for electronically selecting the one or more MEMS elements to be actuated by applying the voltages from the voltage source lines. The gate driver may be configured to apply the gate signals by row of MEMS elements of the MEMS array. Referring to FIG. 9, the control circuit 122 includes a source driver 128 and a gate driver 130. The source driver 128 applies drive signals to the source lines A and B to set the source line voltages either high or low for the various MEMS elements. The gate driver 130 applies the gate signals as described above with respect to FIG. 5, on a row selection basis as $G_{0 \rightarrow n}$. In operation, the source driver 128 sets the source line voltages, which are applied to a given row of MEMS elements upon application of the gate signal electronically selecting that row by the gate driver 130. FIG. 9 further includes a timing diagram for application of the gate signals for row selection. As shown in such diagram, the gate signals $G_{0 \rightarrow n}$ are applied one at a time for row selection respectively at times $t_{0 \rightarrow n}$ through the MEMS array, and between row selection the source line voltages may be updated by the source driver for the next selected elements, with the voltages for a given MEMS element being stored by the memory elements (e.g., capacitors 86 and 88) of the drive circuit 70 as described above in connection with FIG. 5.

Another aspect of the invention is a method of manipulating one or more objects using the micro-electro-mechanical systems (MEMS) array system according to any of the embodiments. In exemplary embodiments, the method includes steps of: providing the two-dimensional MEMS array as detailed above; placing the MEMS array against the one or more objects to be manipulated; electronically selecting one or more of the MEMS elements for actuation; applying voltages to the first electrode and the second electrode of the selected MEMS elements to place the selected MEMS elements in an on state in which the flexible membranes of the selected MEMS elements flex from an initial position to a flexed position relative to the casing structure, whereby the selected MEMS elements generate a suction force against the one or more objects by the flexing of the flexible membranes; and retaining the one or more objects to the MEMS array by operation of the suction forces to perform a manipulation of the one or more objects.

The one or more objects may be one or more microscale objects, the method further comprising: using the suction forces of the selected MEMS elements such that each selected MEMS element lifts a respective microscale object from a first surface; moving a location of the MEMS array while the suction force retains the one or more microscale objects to the respective MEMS elements; and removing the suction force and releasing the one or more microscale objects from the respective MEMS elements, thereby placing the one or more microscale objects on a second surface. Such method may be used, for example, to transfer one or more μLEDs from a source substrate having a first resolution of μLEDs per unit area, to a display substrate having deposition areas at a second resolution different from the first resolution. Such method also may be used to replace a malfunctioned individual μLED from a display substrate with a functional μLED obtained from a source substrate.

Referring to the figures, in one aspect of the invention, the MEMS array system 120 is employed to perform a method for transferring microscale objects, such as μLEDs, from a source substrate such as a wafer substrate, to a target substrate such as a display substrate. In this example, μLEDs are grown on the source wafer, which typically is made of sapphire or silicon, and the μLEDs need to be transferred from the source wafer to the display substrate to which the μLEDs are to be bonded. The MEMS array system 120 with the 2D MEMS array 100 can be configured such that a resolution (i.e., a number of micro devices per unit area) of the MEMS array matches a resolution of the μLED source wafer, so that when the MEMS array is positioned on top of the μLED wafer array the MEMS array can pick up a substantial portion of, up to the entire, array of μLEDs in one step due to the matched resolution. The MEMS array can then selectively deposit the μLEDs at the resolution of the target substrate by selectively controlling each MEMS element to release a respective μLED at a proper location on the target substrate.

For simplicity of description, when a μLED is placed down by a MEMS element, the MEMS element is described as being switched to the "off" state. It will be appreciated, however, that placing a μLED also can be achieved by switching the MEMS element to the repel state. Use of the repel state further may be employed in connection with MEMS elements that have feet including an adhesive material for enhanced bonding to the μLED during pick-up and move operations.

FIGS. 10 and 11 are drawings depicting a method of transferring an array of microscale objects (e.g., an array of μLEDs) from a source wafer substrate to a target display substrate. FIG. 10 is a structural drawing demonstrating control of a MEMS array 140 to perform the transfer method, with FIGS. 10(a)-10(d) illustrating the different states of the MEMS array 140 during the transfer method. FIG. 11 is a flow chart diagram setting forth corresponding steps of the transfer method, with FIGS. 11(a)-11(d) (corresponding to states (a)-(d) of FIG. 10) setting forth the different steps of the transfer method.

FIG. 10 depicts a MEMS array 140 including a plurality of MEMS elements 142. FIG. 10 further includes a key identifying illustrative patterning in the figure indicating when MEMS elements are in the "on" state and the "off" (or repel) state. This same key and illustrative patterning is employed in subsequent figures so as to illustrate MEMS elements as being in the "on" state versus "off" state. In portion FIGS. 10(a) and 11(a), all MEMS elements are in the "off" state as an initial state. The MEMS array 140 is positioned above a source wafer 144 that includes a plurality microscale objects, for example μLEDs 146. A resolution of the MEMS elements 142 on the MEMS array 140 is matched to a first resolution of the μLEDs 146 on the source wafer 144. In a transition from FIG. 10(a) to FIG. 10(b), the MEMS array 140 is aligned with the source wafer 144, such that with the matched resolutions to the first resolution, individual MEMS elements 142 are aligned with respective μLEDs 146. The MEMS array is placed atop the source wafer such that the feet of the MEMS array elements are resting on top of the μLEDs such that each MEMS element is aligned above a respective μLED so as to pick up the array of μLEDs in a single operation.

As shown in portion FIGS. 10(b) and 11(b), a signal is sent to at least a portion of the MEMS electrodes (e.g., from one to all of the MEMS element electrodes), which applies a voltage to said electrodes. The voltage may be large enough to partially or fully actuate the membrane of a MEMS element, but should at least be sufficient to overcome the bonding forces and weight of the μLEDs relative to the source wafer. In this example, the figure shows all MEMS elements being actuated to the "on" state to apply a suction force to all respective μLEDs to lift all μLEDs in a single step, although a portion of the μLEDs need only be lifted as warranted. In addition, actuation of only a portion of the MEMS elements may be useful when the MEMS array and wafer source are different sizes and thus contain different numbers of elements (although as referenced above the resolution of elements per unit area is matched). The MEMS elements 142 that are switched to the "on" state create the suction forces as previously described, acting upwards on the respective μLEDs 146 that are situated below and aligned with the switched "on" MEMS elements. Said μLEDs associated with "on" state MEMS elements are referred to herein as having been "selected". The MEMS array 140 then is moved upwards or lifted, such as by a mechanical arm or other suitable means, which pulls the selected μLEDs 146 upwards off of the wafer source 144.

As shown in portion FIGS. 10(c) and 11(c), the MEMS array 140 is moved to a location of a target substrate 148, such as a display substrate, having a plurality of deposition areas 150 positioned at a second resolution that is different from the first resolution of the source wafer and MEMS array. The deposition areas 150 correspond to areas at which a respective μLED 146 is to be placed. The MEMS array 140 is positioned at a first position in which at least some of the μLEDs 146 are aligned with at least some of the deposition areas 150 on the target display substrate 148. As detailed above, typically the source wafer has a different resolution, and usually a greater resolution, as compared to the display substrate. In the system disclosed herein, the MEMS array is configured to have a resolution matched to the source wafer, and as a result, at any given position only a portion of the μLEDs retained by the MEMS array will be aligned with deposition areas on the display substrate. As shown in portion FIG. 10(c), a first set of MEMS elements 152 is then switched to the "off" (or repel) state to release a first set of respective μLEDs 154 from the MEMS array 140. In particular, the first set of MEMS elements 152 is selected to correspond to a first set of deposition areas 150a of the display substrate 148 at which the first set of respective μLEDs 154 are positioned. By selectively turning off the first set of MEMS elements 152 (i.e., by setting the applied voltage on the electrodes such that the flexible membrane returns to a non-flexed state for the first set of MEMS electrodes), the suction force is removed at the first set of MEMS elements 152, and the respective μLEDs 154 that are positioned above the first set of deposition areas 150a are deposited onto the display substrate at the proper positions within said deposition areas 150a.

As seen in portion FIGS. 10(d) and 11(d), the MEMS array 140 can then be moved to a second, different position relative to the first position. A second set of MEMS elements 156 is then switched to the "off" (or repel) state to release a second set of respective μLEDs 158 from the MEMS array 140. In particular, the second set of MEMS elements 156 is selected to correspond to other second deposition areas 150b of the display substrate 148 at which the second set of respective μLEDs 158 are positioned. Similarly as with the previous step, by selectively turning off the second set of MEMS elements 156, the suction force is removed at the second set of MEMS elements 156, and the respective μLEDs 158 that are now positioned above second deposition areas 150b are deposited onto the display substrate at the proper positions within said deposition areas 150b.

This process of moving the MEMS array to a next position, and selectively switching off (or repel) MEMS elements retaining respective μLEDs located at different deposition areas on the target display substrate, may be repeated until there are no longer any μLEDs retained to the MEMS array, and/or or until all the deposition areas in the display substrate have a μLED. Once all the μLEDs picked up by the MEMS array are so deposited, if empty deposition areas still remain on the display substrate, the MEMS array can "reload" by picking up μLEDs from the source wafer (or a second source wafer) and depositing the μLEDs onto the display substrate using the described method until all the deposition areas are filled.

The process for μLED transfer described above provides a far more efficient method of transfer than that of an elastomeric or electrostatic stamp. As described above, current transfer techniques use a stamp that has the same resolution as the target substrate, whereas a μLED source has a resolution much higher than a display substrate. Accordingly, current stamping techniques require several transfer trips to use up a batch of μLEDs as described above with respect to FIG. 17. In contrast, the MEMS array described herein, with a resolution matched to the source wafer, has the ability to selectively deposit a chosen number of μLEDs while another chosen number of other μLEDs remain attached to the 2D MEMS array. As a result, the MEMS array can have a much higher resolution than current stamping devices, even matching that of the resolution of the μLED source wafer, and still can distribute the μLEDs at the different resolution of the display substrate. The same method cannot be performed using conventional stamp methods because the μLEDs must all be lifted together and then released together, as there is no way in conventional stamps to selectively retain some μLEDs while releasing others as can be done using the selectively actuated MEMS array disclosed herein.

In typical processes of μLED growth on a source wafer, the μLEDs are bonded to the wafer substrate via bonding tethers or a breakaway layer. FIGS. 10(a) and 10(b) illustrate such breakaway layer as layer 145 on source wafer 144. FIG. 12 depicts a close-up view of operation of a MEMS element 142 of FIG. 10 as the element interacts with a μLED 146 when a breakaway layer 145 is utilized. The μLEDs 146 may be attached to the source wafer 144 via tethers or breakaway layer 145. The source wafer may be affixed to a surface below so that the source wafer is unable to move. The MEMS element 142 therefore is configured to generate a suction force sufficient to be greater than a combination of the μLED weight and the bonding force of the tethers or breakaway layer 145.

As shown in portion FIG. 12(a), the MEMS element 142 is placed upon the μLED 146 with the foot on the surface of the μLED as previously described. At this stage, the MEMS element is in the initial "off" state, which in this example is achieved by setting the source line voltages both to a low voltage, for example ground (GND). In the transition of portion FIG. 12(a) to FIG. 12(b), the MEMS element 142 is switched to the "on" state, which in this example is achieved by taking the first source line voltage to a breakaway voltage $V_{cc}$, while maintaining the second source line voltage at ground. In the "on" state, the MEMS membrane is flexed to provide the suction force, and $V_{cc}$ and the design of the MEMS element are configured such that the resultant suction force is sufficient to overcome the combined bonding force of the breakaway layer 145 and the weight of the μLED 146. The lifting of the MEMS element upwards along with the suction force provided thus breaks the tethers or breakaway layer 145 bonding the selected μLED 146 to the source wafer 144, releasing the selected μLED 146 to be picked up by the actuated MEMS element 142. The μLED 146 is thus retained by the MEMS element 142, and the breakaway layer 145 is shown in a fractured state in FIG. 12(b). As shown in portion FIG. 12(c), as detailed above, the μLED 146 then may be deposited within a deposition area 150 on the target display substrate 148 by switching the MEMS element 142 to the "off" (or repel) state.

A display with a μLED array backlight can have several millions of μLEDs, which means there is a high chance of such a display having many hundreds of dead pixels even when transfer yields are at about 99.99%. A MEMS array system as described above can replace individual μLEDs corresponding to individual pixels via the ability to selectively actuate single MEMS elements, which increases the resultant transfer yield by being able to replace any individual μLED corresponding to a dead pixel.

Figure 14:
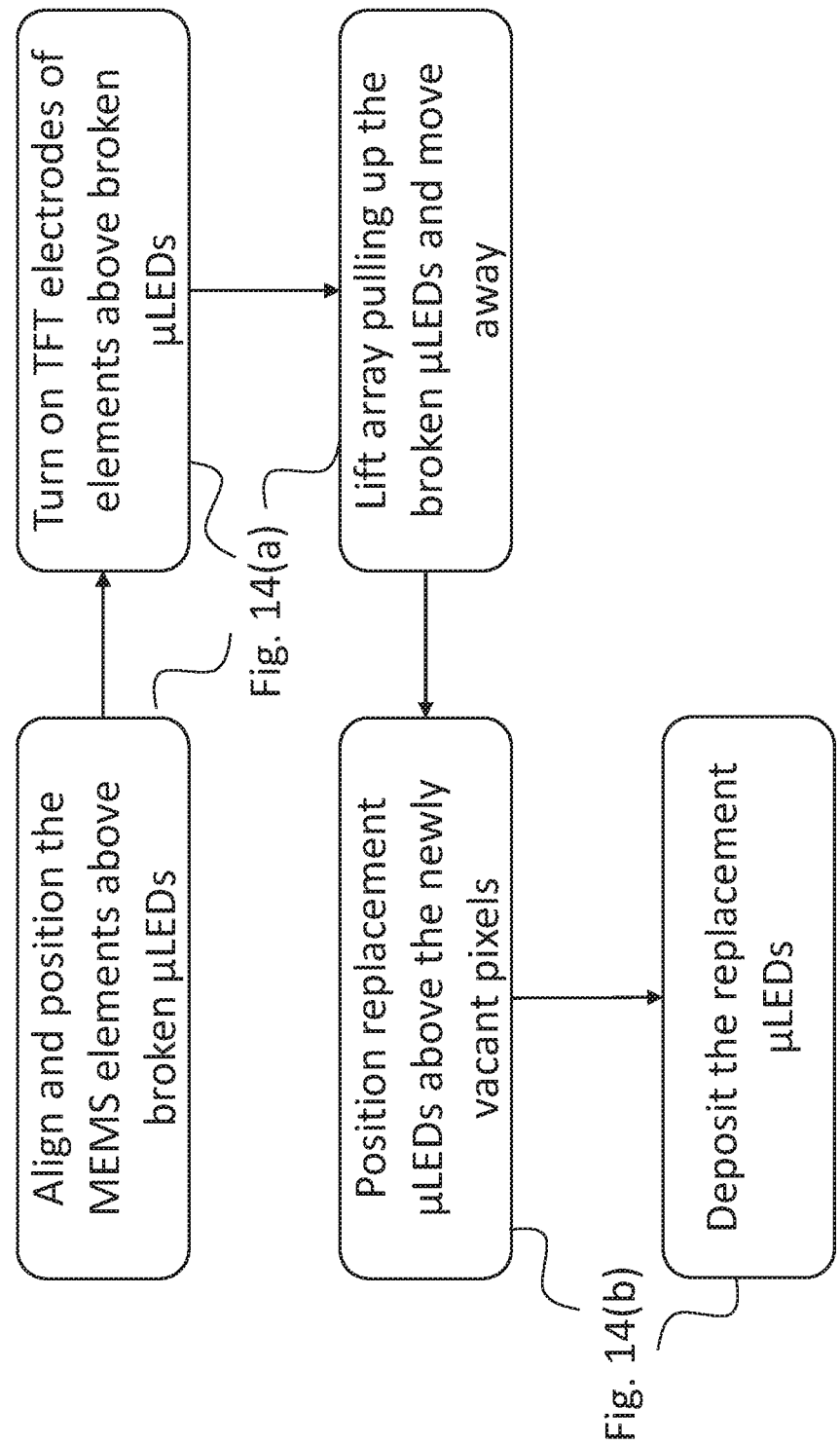
FIG. 14 is a flow chart diagram depicting corresponding steps of the replacement method performed by the device of FIG. 13, with FIGS. 14(a) and 14(b) (corresponding to states (a)-(b) of FIG. 13) setting forth the different steps of the replacement method.

FIGS. 13 and 14 are drawings depicting a method of replacing an individual microscale object (e.g., a μLED) with a replacement microscale object. This example also is illustrated using the above example of manipulating μLEDs. FIG. 13 is a structural drawing demonstrating control of the MEMS array 140 to perform the replacement method, with FIGS. 13(a)-13(b) illustrating the different states of the device during the replacement method. FIG. 14 is a flow chart diagram setting forth corresponding steps of the replacement method, with FIGS. 14(a)-14(b) (corresponding to states (a)-(b) of FIG. 13) setting forth the different steps of the replacement method. The individual MEMS elements 142 as shown in FIG. 13 are illustratively patterned in the figure to identify the "on" and "off" states comparably as in FIG. 10.

As shown in portion FIGS. 13(a) and 14(a), a first MEMS element 160 of the MEMS array 140 is in an "on" state and has retained a functional replacement μLED 162 having previously picked up μLED 162 from a source wafer by methods previously described. Portion FIG. 13(a) further illustrates a malfunctioned μLED 164 located in one of the deposition areas 150 on the display substrate 148, which constitutes a dead pixel. To replace the malfunctioned μLED 164 of a dead pixel, the MEMS array 140 is moved to a first position such that a second MEMS element 166 is aligned above the dead μLED 164. The second MEMS element 166 is switched to the "on" state and picks up the malfunctioned μLED 164 from the deposition area 150 by operation of the suction force. Aside from MEMS elements 160 and 166, other MEMS elements 142 that are not utilized in the replacement method are held in the unactuated "off" state.

As shown in portion FIG. 13(b) and FIG. 14(b), the MEMS array 140 is moved to a second position at which the functional replacement μLED 162 is positioned over the now-vacant deposition area 150. The first MEMS element 160 that retained the replacement μLED 162 is switched to the "off" (or repel) state, and the replacement μLED 162 is deposited in the deposition area 150 from which the malfunctioned μLED 164 had been removed. This process may be carried out for multiple dead μLEDs at one time by individually picking up malfunctioned μLEDs and depositing respective functional μLEDs at suitable positions, using the selective actuation properties of the MEMS array. In an alternative embodiment, by similar processes all malfunctioned μLEDs may be removed in a first step and discarded, and then all the replacement μLEDs are loaded from a source wafer and then deposited in the manner described above.

In previous embodiments, the MEMS array is controlled by selectively actuating MEMS elements such that individual MEMS elements manipulate respective individual microscale objects. In an alternative use of the 2D MEMS array system, the MEMS array is controlled to apply a non-binary or variable force to an object with dimensions greater than two or more MEMS elements, such that multiple MEMS elements apply a combined suction force to a common object. Accordingly, the one or more objects to be manipulated may be a macroscale object that spans a plurality of the selected MEMS elements, the method further comprising using the suction forces of the selected MEMS elements such that multiple MEMS elements apply a combined suction force to manipulate the macroscale object. Such method may include varying a total suction force generated by the MEMS array by varying a proportion of the selected MEMS elements relative to all the MEMS elements in the MEMS array.

Figure 15:
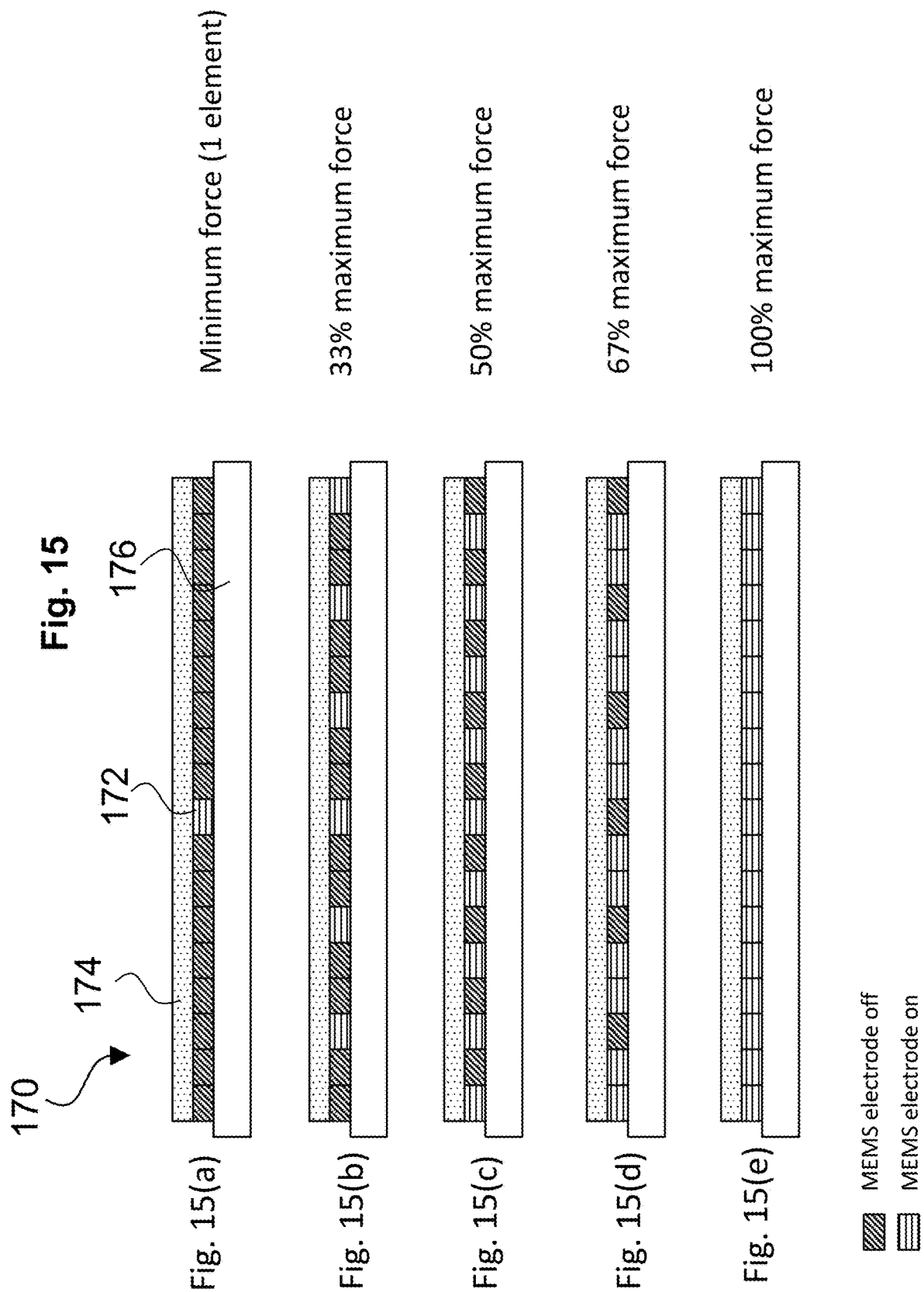
FIG. 15 is a drawing depicting a variable force control of a MEMS array, with portion FIGS. 15(a), 15(b), 15(c), 15(d), and 15(e) showing examples of varied levels of suction force generated by the MEMS array.

FIG. 15 is a drawing depicting a variable force control of a MEMS array, with portion FIGS. 15(a)-(e) showing examples of varied levels of suction force generated by the MEMS array. In this example, a MEMS array 170 includes a plurality of MEMS elements 172 mounted on a substrate 174. The MEMS array is positioned against an object 176 to be manipulated, said object spanning multiple MEMS elements 172, Similarly as in previous examples, a key is provided for illustrative patterning in the figure identifying MEMS elements that are in the "on" state versus MEMS elements that are in the "off" state. By positioning the 2D MEMS array 170 as described above on a macro-sized object (with, for example, dimensions spanning multiple MEMS elements up to a scale of the overall 2D MEMS array), the MEMS elements can be selectively turned on to apply a force that can be varied by changing the number of elements switched to the "on" state.

Portion FIG. 15(a) illustrates a minimum non-zero suction force that can be applied by the MEMS array 170, by which only a single MEMS element 172 is switched to the "on" state. Portion FIGS. 15(b)-(e) illustrate how the total force applied by the MEMS array 170 is varied by switching different proportions of MEMS elements 172 to the "on" state. For example, portion FIG. 15(b) illustrates 33% maximum applied force, i.e. one-third of the MEMS elements 172 are switched to the "on" state; portion FIG. 15(c) illustrates 50% maximum applied force, i.e. one-half of the MEMS elements 172 are switched to the "on" state; and portion FIG. 15(d) illustrates 67% maximum applied force, i.e. two-thirds of the MEMS elements 172 are switched to the "on" state. Portion FIG. 15(e) illustrates a maximum suction force that can be applied by the MEMS array 170, by which all MEMS elements 172 are switch to the "on" state. In an exemplary MEMS array of 10,000 rows and columns of MEMS elements, in which each element can create a suction force of 1 µN, the MEMS array can create a force between 0 N and 100 N with a 1 µN precision based on the proportion of MEMS elements switched to the "on" state.

FIG. 16 is a drawing depicting force control of the MEMS array 170 using multiple MEMS elements to manipulate larger or "microscale" objects, with portion FIGS. 16(a)-(c) showing examples of manipulations of different objects. As described previously, the individual MEMS elements 172 are of microscale dimensions, but for purposes of illustration the size of the individual MEMS elements is substantially exaggerated. Similarly as in previous examples, a key is providing identifying MEMS elements that are in the "on" state versus MEMS elements that are in the "off" state.

For example, portion FIG. 16(a) depicts that area dependent suction force generation could be used as a haptics device that creates a tuneable suction force when touched with, for example, a finger or input instrument, in the context of a touch panel 178. As another example, portion FIG. 16(b) depicts that the MEMS array 170 could be fabricated on a flexible substrate 180 that enables the MEMS array to conform to the shape of a surface of a non-straight object 182, and thereby manipulate such an object in numerous applications. In the illustrated example, such area dependent suction force is being used for a fruit picker that picks fruit without needing to squeeze and therefore potentially damage the fruit. Accordingly, the flexible MEMS array 170 could be mounted on the finger tips and palms of a mechanical/bionic hand that can apply variable gripping forces without squeezing and potentially damaging what is being picked up. Portion FIG. 16(c) depicts that the MEMS array 170 could form a type of conveyor belt track in a variety of configurations that are straight or closed belts, which can be used as a vehicle wheel tread system 184 (analogous to a tank), that could allow robots or like objects to climb walls or steep inclines by gripping to the wall or inclined surface. In a further alternative use, a MEMS array could be used as a type of inkjet printer or micro-printer by which the generation and removal of suction forces can be used to pick up and apply ink in a desired printing pattern. These uses are illustrative examples, and numerous uses of area dependent suction force are possible.

An aspect of the invention, therefore, is a micro-electromechanical systems (MEMS) array system configured to apply suction forces for the manipulation of objects. In exemplary embodiments, the MEMS system includes a two-dimensional MEMS array of a plurality of individual MEMS elements arranged in an array of N rows and M columns with N and M being integers greater than or equal to one. Each MEMS element includes a casing structure; a flexible membrane attached to the casing structure; and an electrode structure, wherein a voltage applied to the electrode structure actuates the MEMS element to cause the flexible membrane to flex relative to the casing structure; wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object. A control circuit is configured to selectively actuate one or more of the MEMS elements of the MEMS array. The MEMS array system may include one or more of the following features, either individually or in combination.

In an exemplary embodiment of the MEMS array system, the MEMS array has a first resolution of MEMS elements per unit area, and the control circuit is configured to selectively actuate the one or more MEMS elements with the actuated elements having a second resolution different from the first resolution.

In an exemplary embodiment of the MEMS array system, the second resolution comprises an individual MEMS element.

In an exemplary embodiment of the MEMS array system, when a voltage is applied to the electrode structure to generate an attractive force between the flexible membrane and a substrate of the casing structure, the flexible membrane is in an on state and flexes in a direction toward the substrate of the casing structure; and when a voltage is not applied to the electrode structure, the flexible membrane is in an off state and the flexible membrane does not flex relative to an initial position.

In an exemplary embodiment of the MEMS array system, when a voltage is applied to the electrode structure in a manner that renders the flexible membrane electrically repulsive relative to the substrate of the casing structure, the flexible membrane is in a repel state and flexes in a direction away from the substrate of the casing structure.

In an exemplary embodiment of the MEMS array system, the casing structure comprises a unitary substrate that spans multiple MEMS elements of the MEMS array, and shared casing walls that extend from the unitary substrate and are shared by adjacent MEMS elements of the MEMS array; the first electrodes are deposited on the unitary substrate; and the flexible membranes are attached to respective surfaces of the shared casing walls opposite from the unitary substrate.

In an exemplary embodiment of the MEMS array system, the control circuit comprises a thin-film transistor (TFT) array.

In an exemplary embodiment of the MEMS array system, the system further includes a sensing circuit configured to sense the presence of an object relative to the one or more MEMS elements; and a system controller configured to receive signals from the sensing circuit and apply control signals to the control circuit for control of the voltages applied to the one or more MEMS elements based on the signals received from the sensing circuit.

In an exemplary embodiment of the MEMS array system, the sensing circuit comprises a capacitive sensing circuit.

In an exemplary embodiment of the MEMS array system, the control circuit comprises a source driver that applies drive signals to voltage source lines for applying voltages to the electrodes of the one or more MEMS elements, and a gate driver that applies gate signals for selection of the one or more MEMS elements to be actuated by applying the voltages from the voltage source lines.

In an exemplary embodiment of the MEMS array system, the gate driver is configured to apply the gate signals by row of MEMS elements of the MEMS array.

In an exemplary embodiment of the MEMS array system, the casing structure includes a flexible substrate on which the MEMS array is mounted to permit the MEMS array to conform to a non-straight surface of an object to be manipulated.

Another aspect of the invention is a method of manipulating one or more objects using a micro-electro-mechanical systems (MEMS) array system. In exemplary embodiments, the method includes the steps of: providing a two-dimensional MEMS array of a plurality of individual MEMS elements according to any of the embodiments, arranged in an array of N rows and M columns, with N and M being integers greater than or equal to one; placing the MEMS array against the one or more objects to be manipulated; providing a control circuit and electronically selecting with the control circuit one or more of the MEMS elements for actuation; applying a voltage to the electrode structure of the selected MEMS elements to place the selected MEMS elements in an on state in which the flexible membranes of the selected MEMS elements flex from an initial position to a flexed position relative to the casing structure, whereby the selected MEMS elements generate a suction force against the one or more objects by the flexing of the flexible membranes; and retaining the one or more objects to the MEMS array by operation of the suction forces to perform a manipulation of the one or more objects. The method of manipulating one or more objects may include one or more of the following features, either individually or in combination.

In an exemplary embodiment of the method of manipulating one or more objects, the method further includes removing the voltage from the electrode structure to place the selected MEMS elements in an off state, whereby the flexible membranes return to the initial position to remove the suction force.

In an exemplary embodiment of the method of manipulating one or more objects, the method further includes comprising applying a voltage to the first electrode and the second electrode of the selected MEMS elements to place the selected MEMS elements in a repel state in which the flexible membranes of the selected MEMS elements flex from the flexed or initial position to an opposite flexed position relative to the on state, whereby the selected MEMS elements generate a repulsion force against the one or more objects to release the one or more objects from the selected MEMS elements.

In an exemplary embodiment of the method of manipulating one or more objects, the one or more objects comprises one or more microscale objects, the method further comprising: using the suction forces of the selected MEMS elements such that each selected MEMS element lifts a respective microscale object from a first surface; moving a location of the MEMS array while the suction force retains the one or more microscale objects to the respective MEMS elements; and removing the suction force and releasing the one or more microscale objects from the respective MEMS elements, thereby placing the one or more microscale objects on a second surface.

In an exemplary embodiment of the method of manipulating one or more objects, the one or more objects comprises a macroscale object that spans a plurality of the selected MEMS elements, the method further comprising using the suction forces of the selected MEMS elements such that multiple MEMS elements apply a combined suction force to manipulate the macroscale object.

In an exemplary embodiment of the method of manipulating one or more objects, the casing structure includes a flexible substrate on which the MEMS array is mounted, the method further comprising conforming the MEMS array to a non-straight surface of the object to be manipulated In an exemplary embodiment of the method of manipulating one or more objects, the method further includes varying a total suction force generated by the MEMS array by varying a proportion of the selected MEMS elements relative to all the MEMS elements in the MEMS array.

The method may be employed for depositing one or more micro light emitting diodes (µLEDs) to a display substrate using a micro-electro-mechanical systems (MEMS) array system. In exemplary embodiments, the deposition method includes placing the MEMS array against a source substrate including the one or more µLEDs; providing a control circuit and electronically selecting one or more of the MEMS elements for actuation with the control circuit; applying a voltage to the electrode structure of the selected MEMS elements to actuate the selected MEMS elements to an on state in which the flexible membranes of the selected MEMS elements flex from an initial position to a flexed position relative to the casing structure, whereby the selected MEMS elements generate a suction force against the one or more µLEDs by the flexing of the flexible membranes to lift a portion of the one or more µLEDs from the source substrate; retaining the lifted µLEDs to respective selected MEMS elements by operation of the suction forces and moving the MEMS array to position the retained µLEDs at the display substrate; and altering the voltage applied to the electrode structure to place the selected MEMS elements in an off state or a repel state, whereby the flexible membranes return to the initial position or flex to a repel position to remove the suction force to deposit the retained µLEDs to respective deposition areas on the display substrate.

In an exemplary embodiment of the deposition method, the source substrate includes a plurality of µLEDs positioned at a first resolution of µLEDs per unit area; the MEMS elements are positioned within the MEMS array at the first resolution; and the deposition areas of the display substrate are positioned on the display substrate at a second resolution different from the first resolution. The deposition method further includes lifting a portion of the plurality of µLEDs with the MEMS array from the source substrate at the first resolution and retaining the lifted µLEDs to the MEMS array at the first resolution; and depositing the retained µLEDs to the respective deposition areas at the second resolution.

In an exemplary embodiment of the deposition method, depositing the retained µLEDs comprises: positioning the MEMS array at a first position in which a first portion of the retained µLEDs are located at first respective deposition areas of the display substrate; depositing the first portion of retained µLEDs to the first respective deposition areas; positioning the MEMS array at a second position in which a second portion of the retained µLEDs are located at second respective deposition areas of the display substrate; and depositing the second portion of retained µLEDs to the second respective deposition areas.

In an exemplary embodiment of the deposition method, the first resolution is greater than the second resolution.

In an exemplary embodiment of the deposition method, the method includes lifting an individual functional µLED from the source substrate by actuating a first MEMS element, and retaining the functional µLED to the first MEMS element by operation of the suction force; moving the MEMS array to position a second MEMS element at a deposition area on the display substrate including a malfunctioned µLED; lifting the malfunctioned µLED from the deposition area by actuating the second MEMS element, and retaining the malfunctioned µLED to the second MEMS element by operation of the suction force; moving the MEMS array to position the first MEMS element at the deposition area from which the malfunctioned µLED was removed; and depositing the functional µLED to the deposition area from which the malfunctioned µLED was removed.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention may be utilized for the manipulation of microscale objects. Fields in which such micro-manipulation can be made applicable is the picking up and placing of microscale electronics. For example, micro-manipulation using MEMS attraction forces can be used to aid the assembly of small components on a printed circuit board (PCB). As another example, micro-manipulation using MEMS attraction forces can be used in the transfer of micro light emitting diodes (µLEDs) from a source substrate to a display or target substrate. Micro-manipulation using MEMS attraction forces could also have applications in biology and chemistry for micro-precision manipulation of small objects such as cells or small amounts of chemical compounds or reagents. The present invention further may be utilized for the manipulation of macroscale objects by the application of area-dependent suction forces applied by multiple MEMS elements in a MEMS array.

REFERENCE SIGNS LIST

10—MEMS element
12—microscale object
20—MEMS element
22—casing structure
24—flexible membrane
26—substrate
28—casing wall
30—end anchor portion
32—central flexing portion
34—gap
36—foot
38—clearance region
40—first electrode, casing electrode
42—second electrode, membrane electrode
44—first voltage source line/source line A
46—second voltage source line/source line B
50—microscale object
52—support surface
52(a)—support surface
54—MEMS element
56—extended foot
58—object
60—object
70—TFT drive circuit
72—first p-type transistor
74—first n-type transistor
76—second p-type transistor
78—second n-type transistor
80—gate line
82—switch
84—switch
86—first capacitor
88—second capacitor
100—2D MEMS array
102—individual MEMS elements
102(a) and 102(b)—adjacent MEMS elements
104—unitary casing substrate
106—shared casing wall
120—MEMS array system
122—control circuit
124—sensing circuit
126—system controller
128—source driver
130—gate driver
140—MEMS array
142—MEMS elements
144—source wafer
145—breakaway layer
146—µLEDS
148—target display substrate
150—deposition areas
150a—first set of deposition areas
150b—second deposition areas
152—first set of MEMS elements
154—first set of µLEDS
156—second set of MEMS elements
158—second set of µLEDS
160—first MEMS element 162—functional replacement µLED
164—malfunctioned µLED
166—second MEMS element
170—MEMS array
172—MEMS elements
174—substrate
176—object
178—touch panel
180—flexible substrate
182—non-straight object
184—vehicle wheel tread system
200—stamp
202—transfer heads
204—micro devices
206—source/growth wafer
208—display substrate

What is claimed is:

1. A micro-electro-mechanical systems (MEMS) array system comprising:
a two-dimensional MEMS array of a plurality of individual MEMS elements arranged in an array of N rows and M columns with N and M being integers greater than or equal to one;
each MEMS element comprising:
a casing structure;
a flexible membrane attached to the casing structure; and
an electrode structure, wherein a voltage applied to the electrode structure actuates the MEMS element to cause the flexible membrane to flex relative to the casing structure;
wherein the flexible membrane and the casing structure define a gap into which the flexible membrane may flex; and
a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object; and
a control circuit configured to selectively actuate one or more of the MEMS elements of the MEMS array;
wherein the clearance region is open oppositely from the flexible membrane.

2. The MEMS array system of claim 1, wherein the MEMS array has a first resolution of MEMS elements per unit area, and the control circuit is configured to selectively actuate the one or more MEMS elements with the actuated elements having a second resolution different from the first resolution.

3. The MEMS array system of claim 2, wherein the second resolution comprises an individual MEMS element.

4. The MEMS array system of claim 1, wherein:
when the voltage comprises a first voltage that is applied to the electrode structure to generate an attractive force between the flexible membrane and a substrate of the casing structure, the flexible membrane is in an on state and flexes in a direction toward the substrate of the casing structure; and
when the voltage is not applied to the electrode structure, the flexible membrane is in an off state and the flexible membrane does not flex relative to an initial position.

5. The MEMS array system of claim 4, wherein when the voltage comprises a second voltage that is applied to the electrode structure in a manner that renders the flexible membrane electrically repulsive relative to the substrate of the casing structure, the flexible membrane is in a repel state and flexes in a direction away from the substrate of the casing structure.

6. The MEMS array system of claim 1, wherein:
the casing structure comprises a unitary substrate that spans multiple MEMS elements of the MEMS array, and shared casing walls that extend from the unitary substrate and are shared by adjacent MEMS elements of the MEMS array;
the electrode structure includes first electrodes that are deposited on the unitary substrate; and
the flexible membranes are attached to respective surfaces of the shared casing walls opposite from the unitary substrate.

7. The MEMS array system of claim 1, wherein the control circuit comprises a thin-film transistor (TFT) array.

8. The MEMS array system of claim 1, further comprising:
a sensing circuit configured to sense the presence of an object relative to the one or more MEMS elements; and
a system controller configured to receive signals from the sensing circuit and apply control signals to the control circuit for control of the voltages applied to the one or more MEMS elements based on the signals received from the sensing circuit.

9. The MEMS array system of claim 8, wherein the sensing circuit comprises a capacitive sensing circuit.

10. The MEMS array system of claim 1, wherein the control circuit comprises a source driver that applies drive signals to voltage source lines for applying voltages to the electrodes of the one or more MEMS elements, and a gate driver that applies gate signals for selection of the one or more MEMS elements to be actuated by applying the voltages from the voltage source lines.

11. The MEMS array system of claim 10, wherein the gate driver is configured to apply the gate signals by row of MEMS elements of the MEMS array.

12. The MEMS array system of claim 1, wherein the casing structure includes a flexible substrate on which the MEMS array is mounted to permit the MEMS array to conform to a non-straight surface of an object to be manipulated.

13. A micro-electro-mechanical systems (MEMS) array system comprising:
a two-dimensional MEMS array of a plurality of individual MEMS elements arranged in an array of N rows and M columns with N and M being integers greater than or equal to one;
each MEMS element comprising:
a casing structure;
a flexible membrane attached to the casing structure; and
an electrode structure, wherein a voltage applied to the electrode structure actuates the MEMS element to cause the flexible membrane to flex relative to the casing structure;
wherein the flexible membrane and the casing structure define a gap into which the flexible membrane may flex; and
a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object; and a control circuit configured to selectively actuate one or more of the MEMS elements of the MEMS array;

wherein the casing structure includes walls that isolate the gaps of adjacent MEMS elements.

14. A micro-electro-mechanical systems (MEMS) array system comprising:
- a two-dimensional MEMS array of a plurality of individual MEMS elements arranged in an array of N rows and M columns with N and M being integers greater than or equal to one;
- each MEMS element comprising:
  - a casing structure;
  - a flexible membrane attached to the casing structure; and
  - an electrode structure, wherein a voltage applied to the electrode structure actuates the MEMS element to cause the flexible membrane to flex relative to the casing structure;
    - wherein the flexible membrane and the casing structure define a gap into which the flexible membrane may flex; and
    - a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object; and
- a control circuit configured to selectively actuate one or more of the MEMS elements of the MEMS array;

wherein at least one foot includes an adhesive material.

* * * * *